United States Patent
Okuyama

(10) Patent No.: US 10,754,180 B2
(45) Date of Patent: Aug. 25, 2020

(54) DISPLAY DEVICE

(71) Applicant: Japan Display Inc., Minato-ku (JP)

(72) Inventor: Kentaro Okuyama, Tokyo (JP)

(73) Assignee: Japan Display Inc., Minato-ku (JP)

( * ) Notice: Subject to any disclaimer, the term of this patent is extended or adjusted under 35 U.S.C. 154(b) by 138 days.

(21) Appl. No.: 15/700,823

(22) Filed: Sep. 11, 2017

(65) Prior Publication Data

US 2018/0074356 A1    Mar. 15, 2018

(30) Foreign Application Priority Data

Sep. 12, 2016 (JP) .................. 2016-177686

(51) Int. Cl.
| | | |
|---|---|---|
| *G02F 1/133* | (2006.01) | |
| *G02F 1/163* | (2006.01) | |
| *G02F 1/167* | (2019.01) | |
| *G02F 1/1334* | (2006.01) | |
| *H01L 51/50* | (2006.01) | |
| *H01L 33/02* | (2010.01) | |
| *G02F 1/137* | (2006.01) | |
| *G02F 1/157* | (2006.01) | |
| *H01L 27/32* | (2006.01) | |

(52) U.S. Cl.
CPC .......... *G02F 1/13318* (2013.01); *G02F 1/163* (2013.01); *G02F 1/1334* (2013.01); *G02F 1/13725* (2013.01); *G02F 1/157* (2013.01); *G02F 1/167* (2013.01); *G02F 2201/44* (2013.01); *H01L 27/3232* (2013.01); *H01L 27/3269* (2013.01); *H01L 33/02* (2013.01); *H01L 51/5012* (2013.01)

(58) Field of Classification Search
CPC ..... G02F 1/13318; G02F 1/163; G02F 1/1334
See application file for complete search history.

(56) References Cited

U.S. PATENT DOCUMENTS

| | | | |
|---|---|---|---|
| 2015/0085334 A1* | 3/2015 | Joo ........................ | G02B 5/201 359/228 |
| 2015/0187283 A1* | 7/2015 | Jiang ..................... | G09G 3/342 345/690 |
| 2016/0223736 A1* | 8/2016 | Karakawa ........... | G02B 6/0036 |
| 2017/0219840 A1 | 8/2017 | Okuyama | |

FOREIGN PATENT DOCUMENTS

| | | |
|---|---|---|
| JP | 2007-114584 | 5/2007 |
| JP | 2007-281864 | 10/2007 |
| JP | 2014-142399 | 8/2014 |
| JP | 2014-228777 | 12/2014 |

\* cited by examiner

*Primary Examiner* — Lucy P Chien
(74) *Attorney, Agent, or Firm* — Oblon, McClelland, Maier & Neustadt, L.L.P.

(57) ABSTRACT

According to one embodiment, a display device includes a display panel including a first outer surface and a second outer surface which is on a side opposite to the first outer surface, a light-modulating element opposed to the first outer surface, a first optical sensor which measures brightness on a first outer surface side of the display panel, and a controller which controls a transmittance of the light-modulating element on the basis of a measurement result obtained from the first optical sensor.

8 Claims, 14 Drawing Sheets

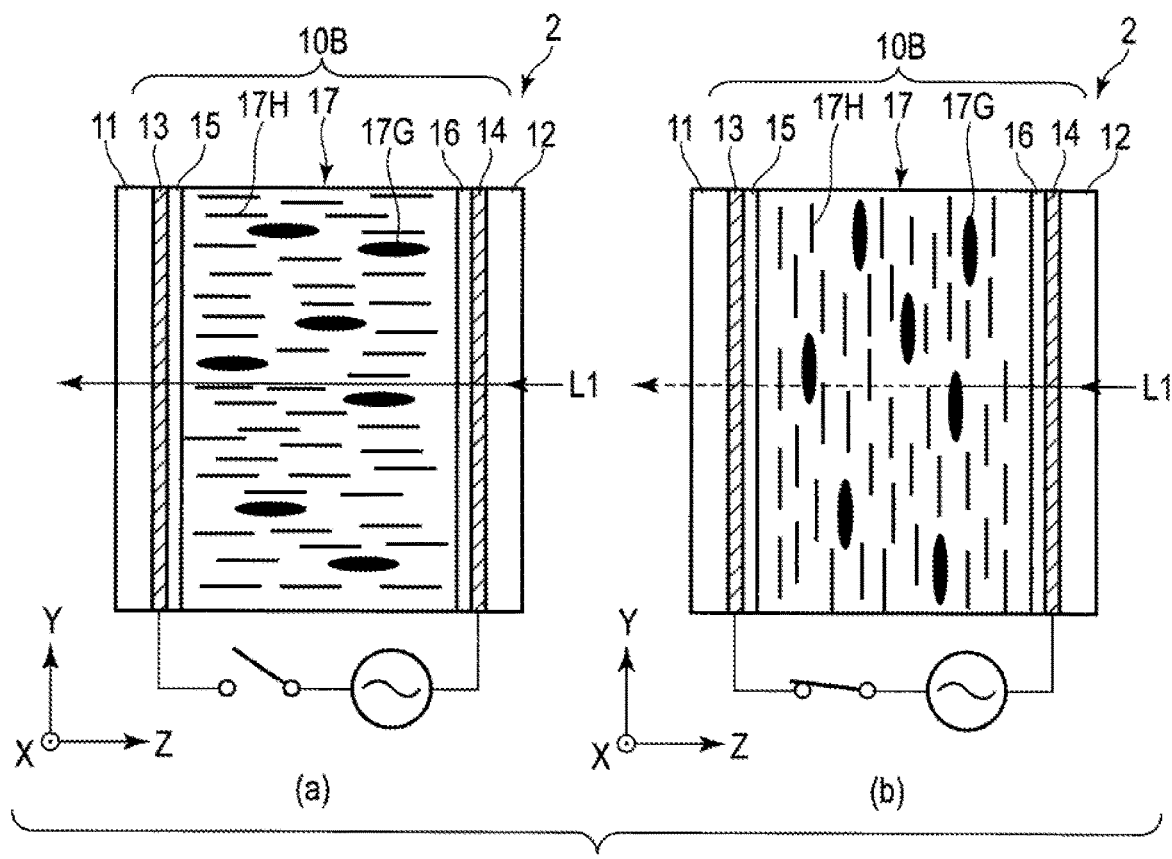
F I G. 10
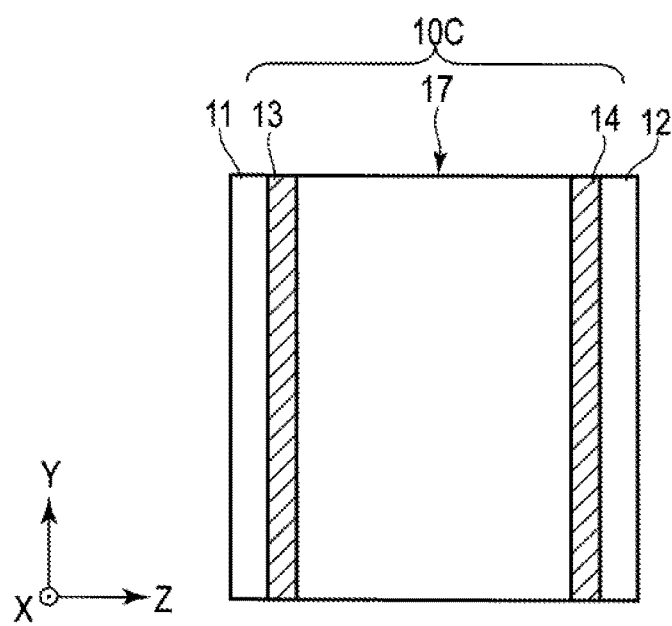
F I G. 11

DISPLAY DEVICE

CROSS-REFERENCE TO RELATED APPLICATIONS

This application is based upon and claims the benefit of priority from Japanese Patent Application No. 2016-177686, filed Sep. 12, 2016, the entire contents of which are incorporated herein by reference.

FIELD

Embodiments described herein relate generally to a display device.

BACKGROUND

Recently, various double-sided display devices have been proposed. In one example, a double-sided display device which includes a first display portion which displays an image on a front surface, and a second display portion which displays an image on a back surface, and determines display data to be displayed on the first display portion and the second display portion by detecting a position or movement of a person at the surrounding has been proposed. Also, a double-sided display device which includes a front-surface-side display panel provided on the front surface side, and a back-surface-side display panel provided on the back surface side, and conforms each of an image on the front surface side and an image on the back surface side to a viewing condition of a viewer has been proposed.

In a display device, display light becomes hard to be visually recognized due to the influence of the peripheral external light. Accordingly, even when an image is displayed in an environment in which the surrounding of the display device is bright, it is required to suppress deterioration in display quality.

BRIEF DESCRIPTION OF THE DRAWINGS

FIG. 10 is a drawing showing another configuration example of the light-modulating element 2.

FIG. 11 is a drawing showing yet another configuration example of the light-modulating element 2.

DETAILED DESCRIPTION

Figure 1:
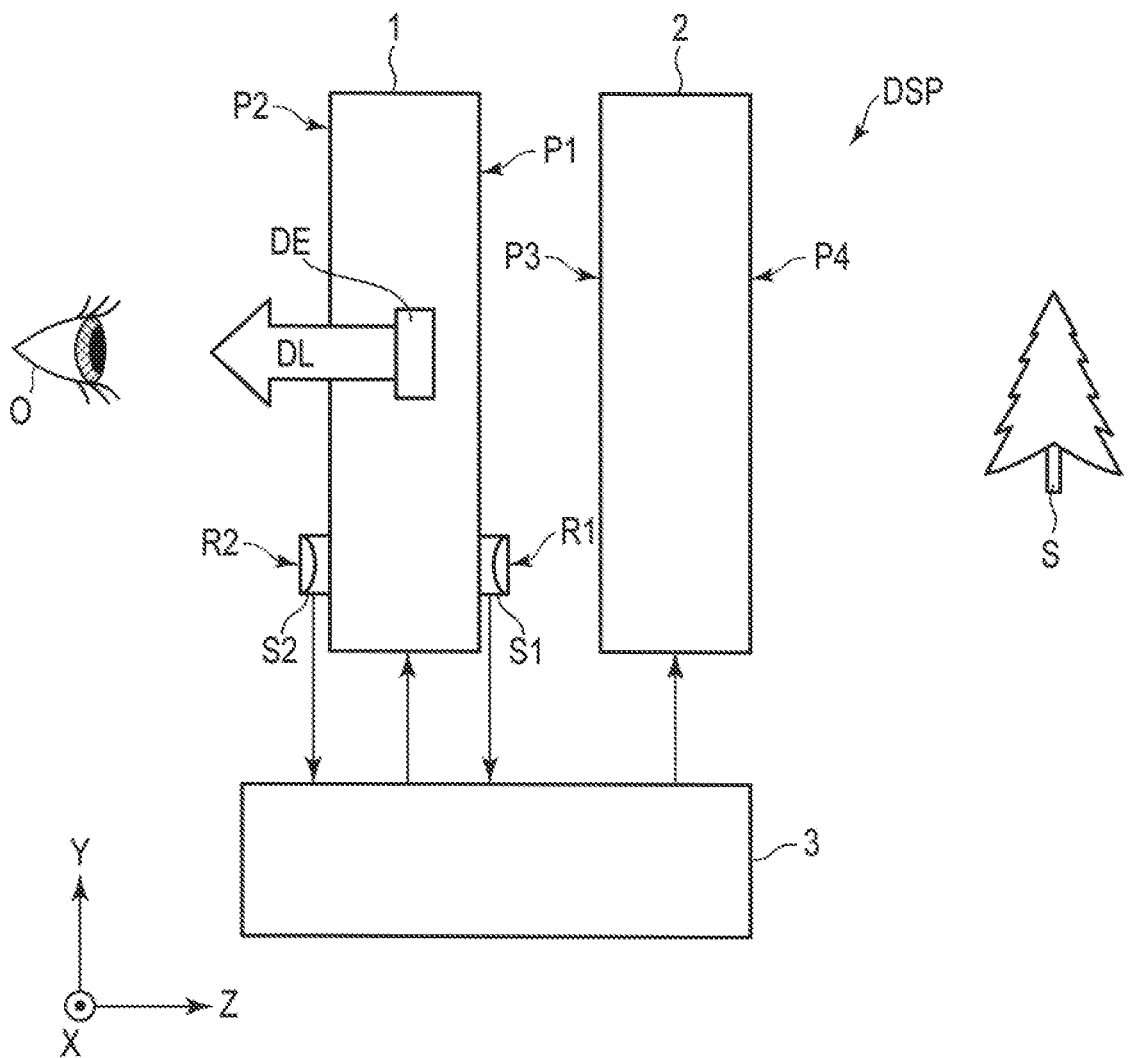
FIG. 1 is an illustration showing a configuration example of a display device DSP of the present embodiment.

In general, according to one embodiment, a display device includes a display panel including a first outer surface and a second outer surface which is on a side opposite to the first outer surface; a light-modulating element opposed to the first outer surface; a first optical sensor which measures brightness on a first outer surface side of the display panel; and a controller which controls a transmittance of the light-modulating element on the basis of a measurement result obtained from the first optical sensor.

According to another embodiment, a display device includes a display panel including a first outer surface and a second outer surface which is on a side opposite to the first outer surface, the display panel comprising a display element having a non-display mode in which light is transmitted between the first outer surface and the second outer surface, and a display mode in which display is made toward the second outer surface; and a light-modulating element including a third outer surface opposed to the first outer surface, and a fourth outer surface which is on a side opposite to the third outer surface, the light-modulating element controlling a transmittance of light which is transmitted between the third outer surface and the fourth outer surface, the light-modulating element being set to have a first transmittance in the non-display mode, and a second transmittance lower than the first transmittance in the display mode.

According to yet another embodiment, a display device includes a display panel including a first outer surface and a second outer surface which is on a side opposite to the first outer surface, the display panel comprising a first area including a display element having a non-display mode in which light is transmitted between the first outer surface and the second outer surface, and a display mode in which display is made toward the second outer surface, and a transparent second area which transmits the light between the first outer surface and the second outer surface; and a light-modulating element including a third outer surface opposed to the first outer surface, and a fourth outer surface which is on a side opposite to the third outer surface, the light-modulating element comprising a third area which is opposed to the first area, and a transparent fourth area which is opposed to the second area and transmits the light between the third outer surface and the fourth outer surface, the third area being set to have a first transmittance in the non-display mode, and a second transmittance lower than the first transmittance in the display mode.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are illustrated in the drawings schematically, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, and redundant detailed description thereof is omitted unless necessary.

FIG. 1 is an illustration showing a configuration example of a display device DSP of the present embodiment. While a first direction X, a second direction Y, and a third direction Z in the drawing are orthogonal to each other, they may cross each other at an angle other than 90 degrees. The third direction Z corresponds to a direction of arrangement of elements which constitutes the display device DSP.

The display device DSP includes a display panel 1, a light-modulating element 2, a first optical sensor S1, a second optical sensor S2, and a controller 3. The display panel 1 and the light-modulating element 2 are arranged in the third direction Z in this order. An observation position O at which the display device DSP is observed faces the display panel 1. In one example, each of the display panel 1 and the light-modulating element 2 is configured to be in a flat plate shape.

The display panel 1 includes an outer surface (a first outer surface) P1, and another outer surface (a second outer surface) P2 which is on the side opposite to the outer surface P1. Here, the outer surface P2 corresponds to a face facing the observation position O, and the outer surface P1 corresponds to a face facing the side opposite to the observation position O. That is, at the observation position O, the display device DSP is observed along the third direction Z, and light which is emitted from the display device DSP in a direction opposite to the third direction Z can be visually recognized.

The display panel 1 includes a display element DE between the outer surface P1 and the outer surface P2. The display element DE has a display mode in which display light DL is emitted toward the outer surface P2 (or toward the observation position O), and a non-display mode in which light is transmitted between the outer surface P1 and the outer surface P2. In one example, the display element DE is a self-luminous element such as a liquid crystal element which selectively emits light from a separately provided light source toward the outer surface P2, or an electroluminescent (EL) element which emits light emitted by a light-emitting layer toward the outer surface P2. Examples of the EL element are an organic EL element and an inorganic EL element.

The light-modulating element 2 is arranged at a position opposed to the outer surface P1. The light-modulating element 2 includes an outer surface (a third outer surface) P3 opposed to the outer surface P1, and another outer surface (a fourth outer surface) P4 which is on the side opposite to the outer surface P3. The light-modulating element 2 has the function of varying transmissivity of light between the outer surface P3 and the outer surface P4. In one example, the light-modulating element 2 includes a suspended particle device (SPD), a guest-host liquid crystal element, and an electrochemical reaction element such as an electrochromic element and an electrodeposition element.

Note that the outer surfaces P1 to P4 described above are, for example, surfaces which are parallel to an X-Y plane defined by the first direction X and the second direction Y. In the example illustrated, the third direction Z is parallel to a normal line of each of the outer surfaces P1 to P4. The outer surfaces P2, P1, P3, and P4 are arranged in the third direction Z in this order.

The first optical sensor S1 measures the brightness of the outer surface P1 of the display panel 1. Accordingly, a light receiving surface R1 of the first optical sensor S1 faces the side opposite to the observation position O. The second optical sensor S2 measures the brightness of the outer surface P2 of the display panel 1. Accordingly, a light receiving surface R2 of the second optical sensor S2 faces the observation position O. In other words, the light receiving surfaces R1 and R2 face the sides opposite to each other. The first optical sensor S1 and the second optical sensor S2 are constituted of, for example, a photoelectric transducer such as a photodiode or a phototransistor. Each of these sensors is an illuminometer which measures the illuminance as the brightness, for instance. In the example illustrated, the first optical sensor S1 is provided on the outer surface P1, and the second optical sensor S2 is provided on the outer surface P2. However, positions where the first optical sensor S1 and the second optical sensor S2 are installed are not limited to this example.

The controller 3 receives measurement results obtained from the first optical sensor S1 and the second optical sensor S2, and controls the display panel 1 and the light-modulating element 2. In one example, the controller 3 controls the transmittance of the light-modulating element 2, on the basis of the measurement result obtained from the first optical sensor S1. The controller 3 also controls the display luminance of the display element DE in the display panel 1, on the basis of the measurement result obtained from the second optical sensor S2. An example of such control will be described below.

Figure 2:
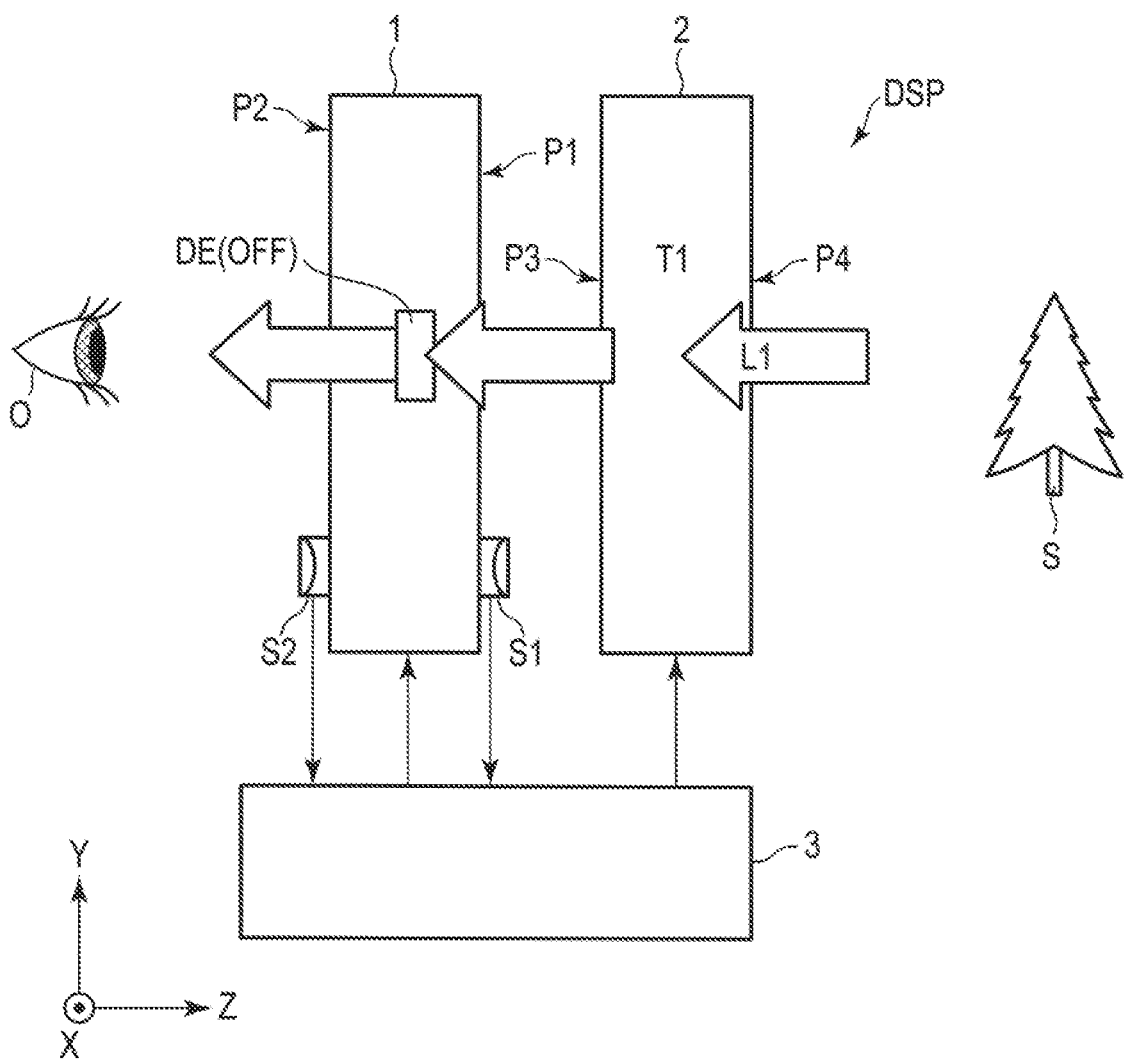
FIG. 2 is an illustration showing the display device DSP in a state in which a display element DE is set to a non-display mode.

FIG. 2 is an illustration showing the display device DSP in a state in which the display element DE is set to the non-display mode.

When the display element DE is set to the non-display mode (OFF), the controller 3 sets the light-modulating element 2 to have a first transmittance T1. The first transmittance T1 in this context corresponds to a maximum level of transmittance of the light-modulating element 2, for example. The light-modulating element 2 at this time should preferably be transparent. Accordingly, light L1 which travels from the side opposite to the observation position O toward the display device DSP enters the light-modulating element 2, is hardly absorbed or shielded by the light-modulating element 2, and passes through the light-modulating element 2. Note that the first transmittance T1 is not necessarily set to the maximum level of transmittance of the light-modulating element 2, and may be set to a transmittance of a lower level than the maximum level of transmittance as appropriate in accordance with the brightness at the surrounding of the display device DSP.

The light L1 which has passed through the light-modulating element 2 enters the display panel 1. The display panel 1 has transparency to such a level that the light is transmitted between the outer surface P1 and the outer surface P2 in a state in which the display element DE is set to the non-display mode. Accordingly, the light L1 incident on the display panel 1 passes through the display element DE, and is emitted from the display panel 1. In other words, when the display device DSP is observed from the observation position O, a substance S on the opposite side of the observation position O can be observed over the display device DSP.

Figure 3A:
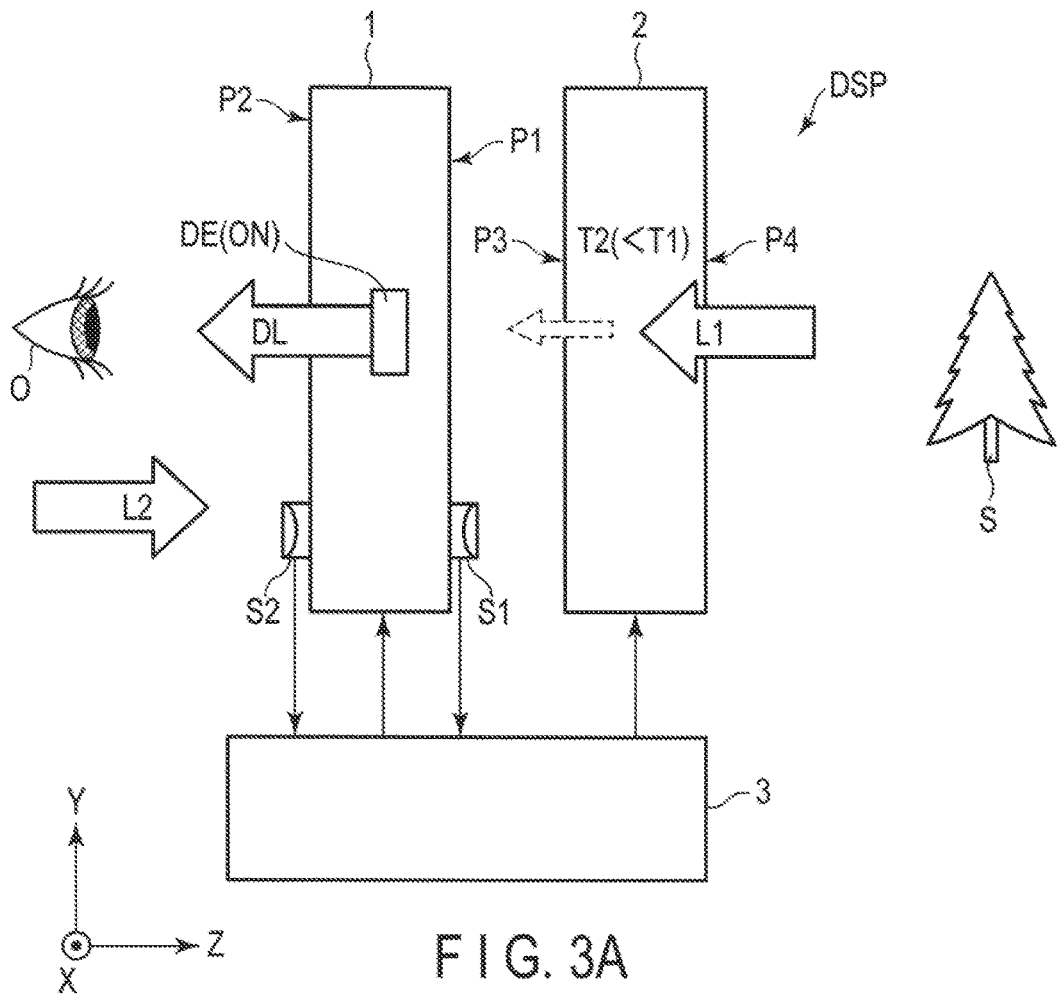
FIG. 3A is an illustration showing the display device DSP in a state in which the display element DE is set to a display mode.

FIG. 3A is an illustration showing the display device DSP in a state in which the display element DE is set to the display mode.

When the display element DE is set to the display mode (ON), the controller 3 sets the light-modulating element 2 at a second transmittance T2 lower than the first transmittance T1. The second transmittance T2 in the above can be adjusted within a range that is lower than the transmittance of the maximum level in the light-modulating element 2, and greater than or equal to a transmittance of a minimum level in the light-modulating element 2. The controller 3 determines the second transmittance T2 on the basis of a measurement result obtained from the first optical sensor S1.

Figure 3B:
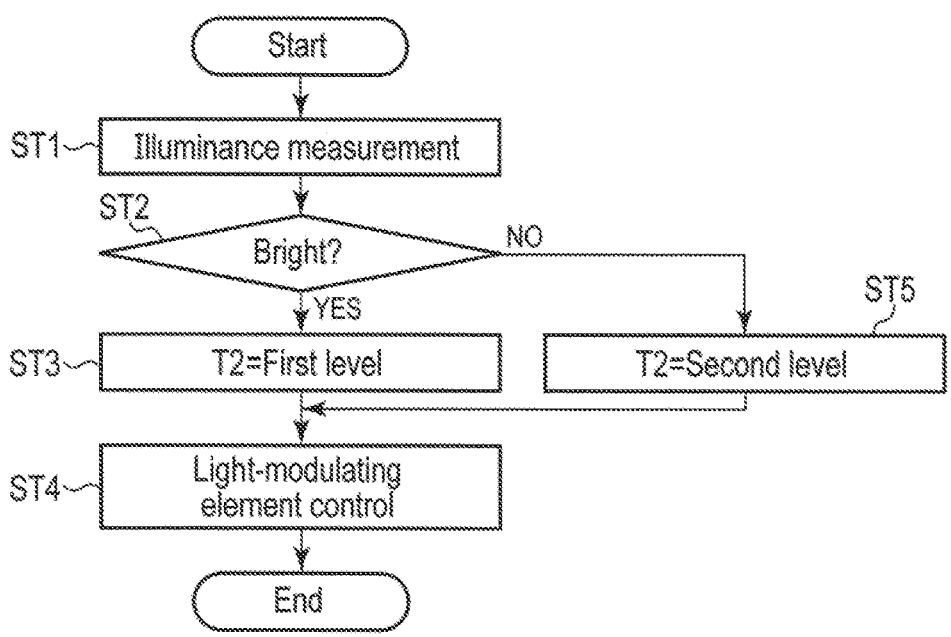
FIG. 3B is an illustration showing an example of a method of controlling the display device DSP in the display mode.

For example, as shown in FIG. 3B, the controller 3 controls the first optical sensor S1, and measures the illuminance at the surrounding of the display device DSP (ST1). Next, when the controller 3 determines, on the basis of the measurement result obtained from the first optical sensor S1, that the surrounding of the display device DSP is bright (i.e., has a first illuminance) (ST2, YES), the controller 3 determines that the second transmittance T2 should be set to a transmittance of a first level with respect to the light-modulating element 2 (i.e., the transmittance of the minimum level) (ST3). Next, the controller 3 controls the light-modulating element 2 to have the determined transmittance (ST4). Also, when the controller 3 determines, on the basis of the measurement result obtained from the first optical sensor S1, that the surrounding of the display device DSP is dark (i.e., has a second illuminance) (ST2, NO), the controller 3 determines that the second transmittance T2 should be set to a transmittance of a second level with respect to the light-modulating element 2 (ST5), and controls the light-modulating element 2 to have the determined transmittance (ST4). The second illuminance is lower than the first illuminance. The first level is lower than the maximum level, and greater than or equal to the minimum level. The second level is lower than the maximum level, and greater than or equal to the first level.

In this way, the controller 3 controls the transmittance of the light-modulating element 2 in accordance with the brightness of the surrounding of the display device DSP. When the controller 3 determines, on the basis of the measurement result obtained from the first optical sensor S1, for example, that the surrounding of the display device DSP is bright, the controller 3 determines that the second transmittance T2 should be set to the transmittance of the minimum level with respect to the light-modulating element 2, and controls the light-modulating element 2 to have the determined transmittance. Accordingly, the light L1 which travels from the side opposite to the observation position O toward the display device DSP enters the light-modulating element 2, and most of the light is absorbed or shielded by the light-modulating element 2. Thereby, a back surface side of the display panel 1 is dimmed to a state of a relatively low transmittance by the light-modulating element 2. Meanwhile, the display panel 1 emits the display light DL from the display element DE toward the observation position O. Accordingly, when the display device DSP is observed from the observation position O, visibility of the display light DL can be improved almost without being affected by the light L1. Accordingly, even in an environment in which the surrounding of the display device DSP is bright, deterioration in display quality can be suppressed.

Also, the controller 3 determines the display luminance of the display element DE on the basis of the measurement result obtained from the second optical sensor S2. For example, when the controller 3 determines that the surrounding of the display device DSP is bright on the basis of the measurement result obtained from the second optical sensor S2, the controller 3 controls the display panel 1 to increase the display luminance of the display element DE. Accordingly, when the display device DSP is observed from the observation position O, although light L2 which travels from the side of the observation position O toward the display device DSP is reflected by display panel 1, visibility of the display light DL can be improved.

Also, since the first optical sensor S1 is provided on the outer surface P1, brightness of the outer surface P1 illuminated by the light L1 which has passed through the light-modulating element 2 can be directly measured. Accordingly, the controller 3 can perform feedback control of the light-modulating element 2.

Next, another configuration example of the display device DSP of the present embodiment will be described with reference to FIGS. 4 and 5.

Figure 4:
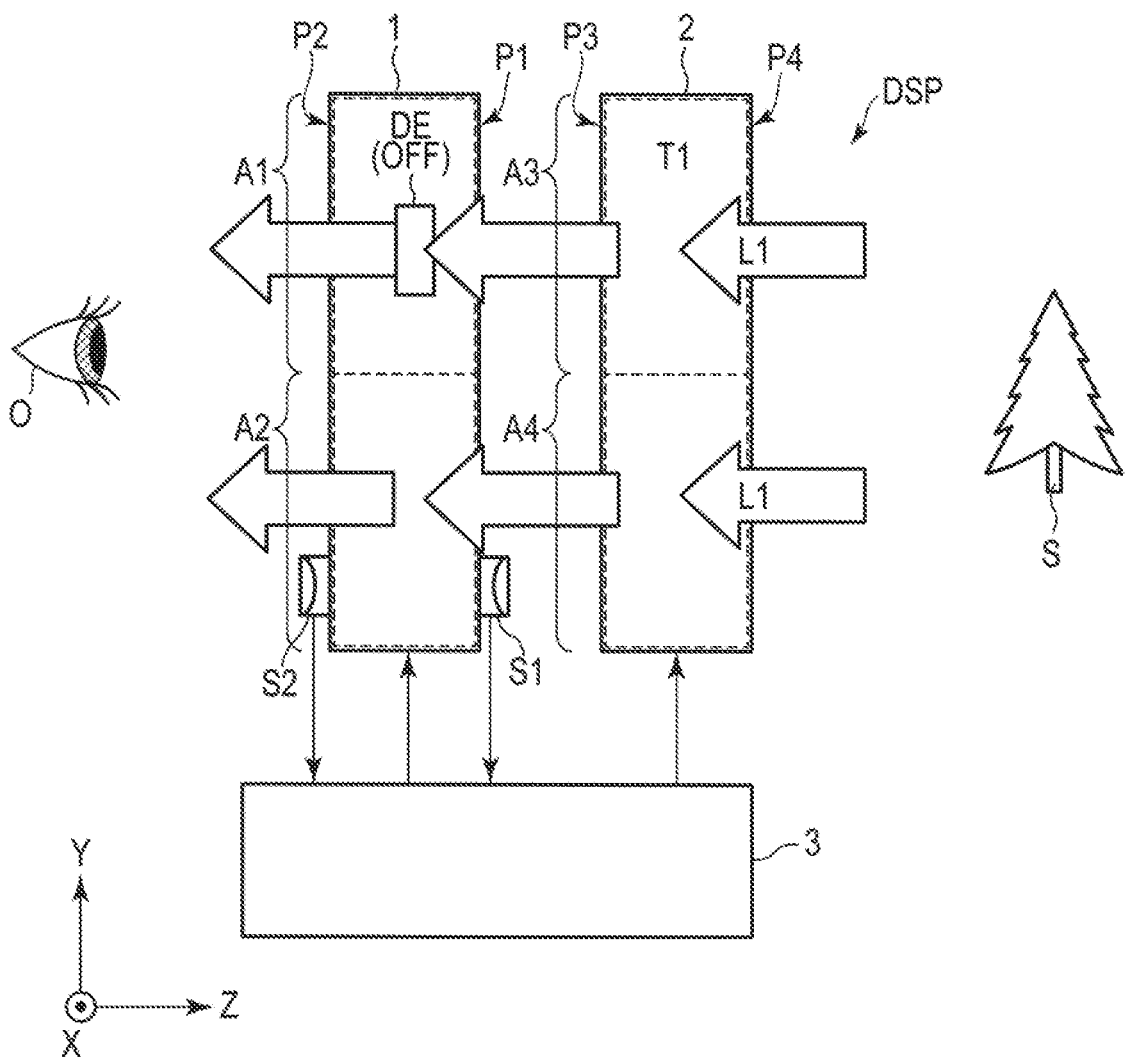
FIG. 4 is an illustration showing another configuration example of the display device DSP of the present embodiment, and representing the display device DSP in a state in which the display element DE is set to a non-display mode.

FIG. 4 is an illustration showing the display device DSP in a state in which the display element DE is set to a non-display mode.

The display panel 1 includes a first area A1 comprising the display element DE, and a second area A2 not comprising the display element DE. The first area A1 is structured likewise the display panel 1 explained referring to FIGS. 2 and 3A, and the display element DE has a display mode and a non-display mode. The second area A2 does not comprise the display element DE, and is a transparent area which transmits light between the outer surface P1 and the outer surface P2. In other words, the transmittance of the second area A2 is constant regardless of whether the display element DE in the first area A1 is in the display mode or the non-display mode.

The light-modulating element 2 includes a third area A3 opposed to the first area A1, and a fourth area A4 opposed to the second area A2. The third area A3 is an area whose transmittance can be controlled by the controller 3. The fourth area A4 is a transparent area which transmits light between the outer surface P3 and the outer surface P4. In one example, the transmittance of the fourth area A4 is constant regardless of whether the display element DE in the first area A1 is in the display mode or the non-display mode.

When the display element DE is set to the non-display mode, the controller 3 sets the third area A3 of the light-modulating element 2 to have a first transmittance 1. In one example, the first transmittance T1 of the third area A3 is set equally to the transmittance of the fourth area A4. Here, both of the third area A3 and the fourth area A4 should preferably be transparent. Also, in the display panel 1, both of the first area A1 and the second area A2 are transparent, and the transmittances of these areas are equal to each other. Accordingly, when the display device DSP is observed from the observation position O, a substance S on the opposite side of the observation position O can be observed over the display device DSP.

Figure 5:
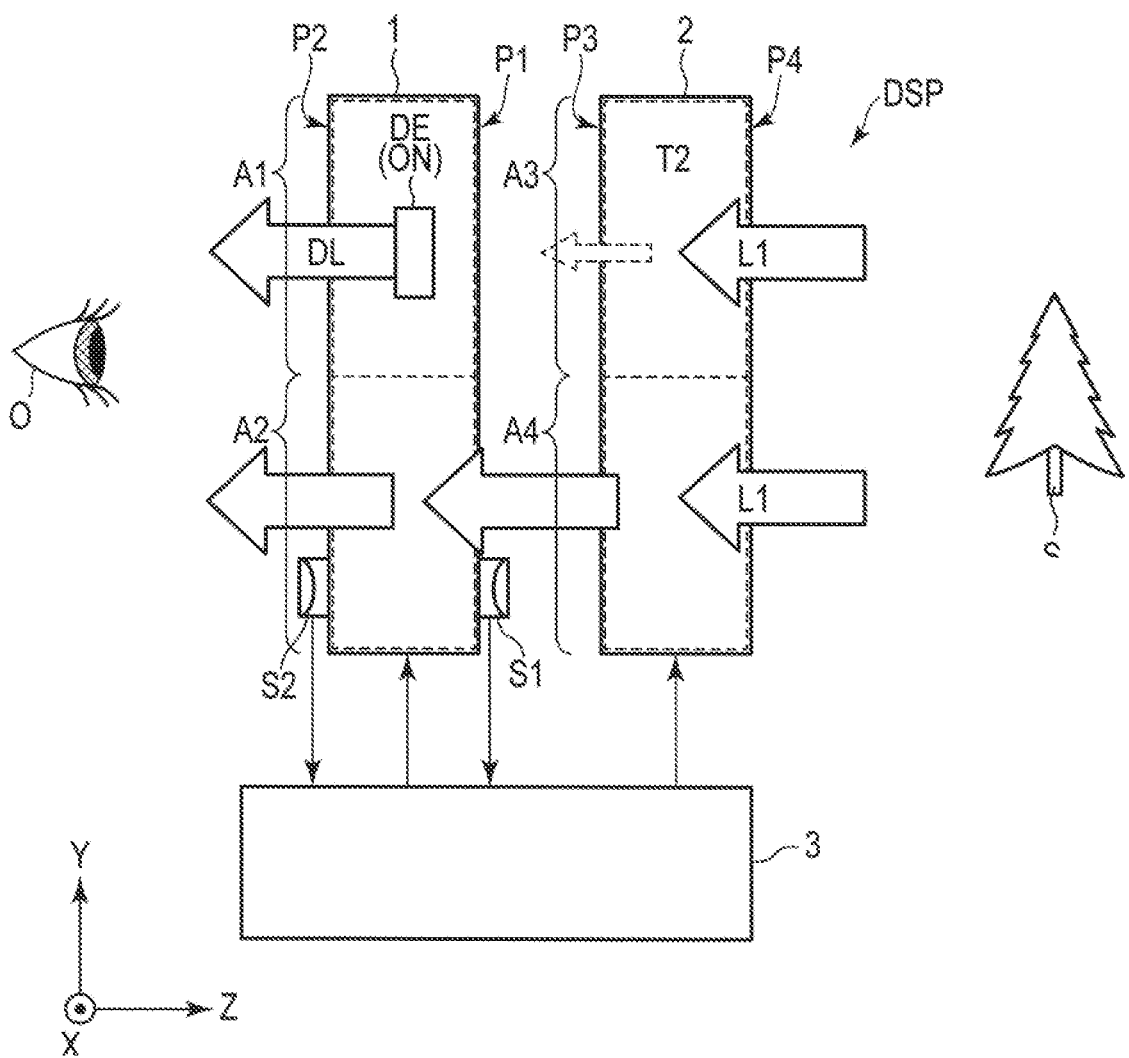
FIG. 5 is an illustration showing another configuration example of the display device DSP of the present embodiment, and representing the display device DSP in a state in which the display element DE is set to a display mode.

FIG. 5 is an illustration showing the display device DSP in a state in which the display element DE is set to the display mode.

When the display element DE is set to the display mode, the controller 3 sets the third area A3 of the light-modulating element 2 to have a second transmittance T2 lower than the first transmittance T1, on the basis of a measurement result obtained from the first optical sensor S1. Note that the level of the second transmittance T2 can be set variously on the basis of the measurement result obtained from the first optical sensor S1, as described above. Accordingly, light L1 which travels from the side opposite to the observation position O toward the display device DSP is mostly absorbed or shielded by the third area A3 of the light-modulating element 2. Thereby, a back surface side of the first area A1 is dimmed to a state of a relatively low transmittance by the third area A3. Meanwhile, the display element DE of the first area A1 emits the display light DL toward the observation position O. Accordingly, when the display device DSP is observed from the observation position O, visibility of the display light DL in the first area A1 of the display panel 1 can be improved almost without being affected by the light L1.

Note that the fourth area A4 at this time may be transparent as in the state shown in FIG. 4. That is, the transmittance of the fourth area A4 is substantially equal to the first transmittance T1. In this case, when the display device DSP is observed from the observation position O, the substance S can be observed over the second area A2 of the display panel 1. Meanwhile, the fourth area A4 may be set to have the second transmittance T2 likewise the third area A3. In this case, since the second area A2 around the first area A1 of the display panel 1 is dimmed, visibility of the first area A1 can be improved.

The display luminance of the display element DE is controlled by the controller 3 on the basis of the measurement result obtained from the second optical sensor S2, as in the state shown in FIG. 3A.

Figure 6:
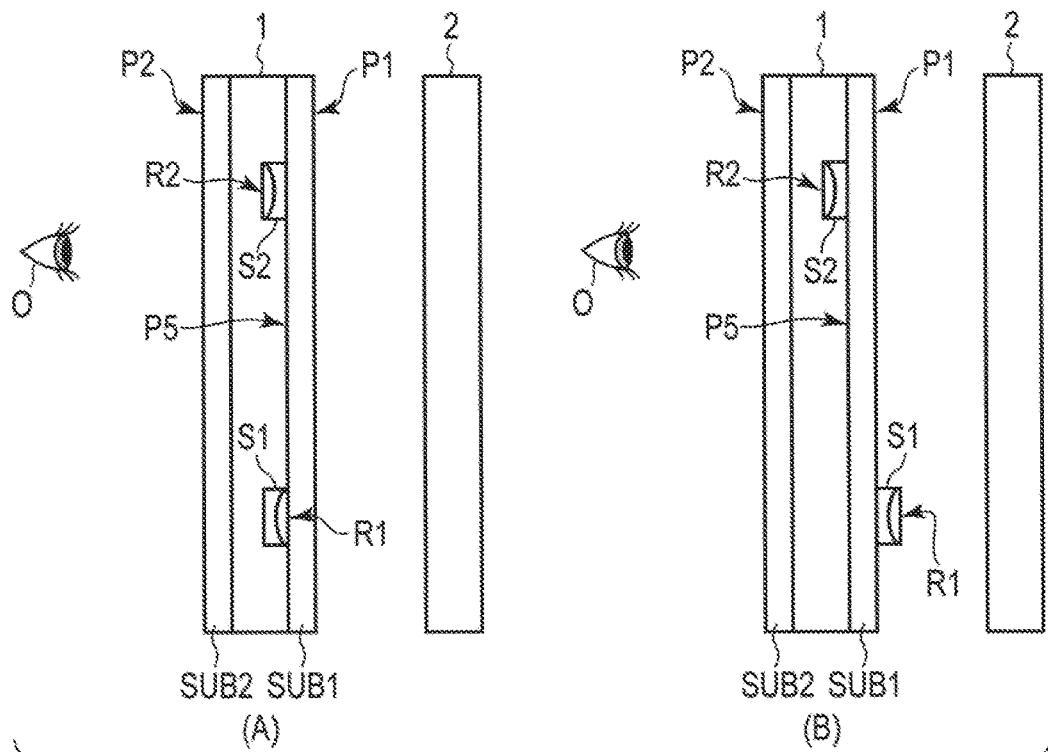
FIG. 6 is a drawing for explaining another installation position of each of a first optical sensor S1 and a second optical sensor S2.

FIG. 6 is a drawing for explaining another installation position of each of the first optical sensor S1 and the second optical sensor S2. In the example illustrated, the display panel 1 comprises a first substrate SUB1 including the outer surface P1, and a second substrate SUB2 including the outer surface P2. The first optical sensor S1 and the second optical sensor S2 are both provided on the first substrate SUB1.

In the example shown in FIG. 6(A), the first optical sensor S1 and the second optical sensor S2 are both provided on an inner surface P5 of the first substrate SUB1, which is opposed to the second substrate SUB2. Note that the inner surface P5 intended here may be any surface as long as it is between an insulating substrate which constitutes the first substrate SUB1 and the second substrate SUB2. Also, the outer surface P1 may be any surface as long as it is between the insulating substrate and the light-modulating element 2. From the standpoint of simplifying the manufacturing process, the first optical sensor S1 and the second optical sensor S2 should preferably be provided in the same layer in the first substrate SUB1. Alternatively, the first optical sensor S1 and the second optical sensor S2 may be provided in different layers of the first substrate SUB1. Further, the first optical sensor S1 and the second optical sensor S2 may both be provided on the outer surface P1 of the first substrate SUB1. The light receiving surface R1 of the first optical sensor S1 is opposed to the first substrate SUB1, and the light receiving surface R2 of the second optical sensor S2 is opposed to the second substrate SUB2.

In the example shown in FIG. 6(B), the first optical sensor S1 is provided on the outer surface P1, and the second optical sensor S2 is provided on the inner surface P5.

In either of the examples shown in FIG. 6, the light receiving surface R1 of the first optical sensor S1 faces the side opposite to the observation position O (or is opposed to the outer surface P1), and the light receiving surface R2 of the second optical sensor S2 faces the side of the observation position O (or is opposed to the outer surface P2).

Figure 7:
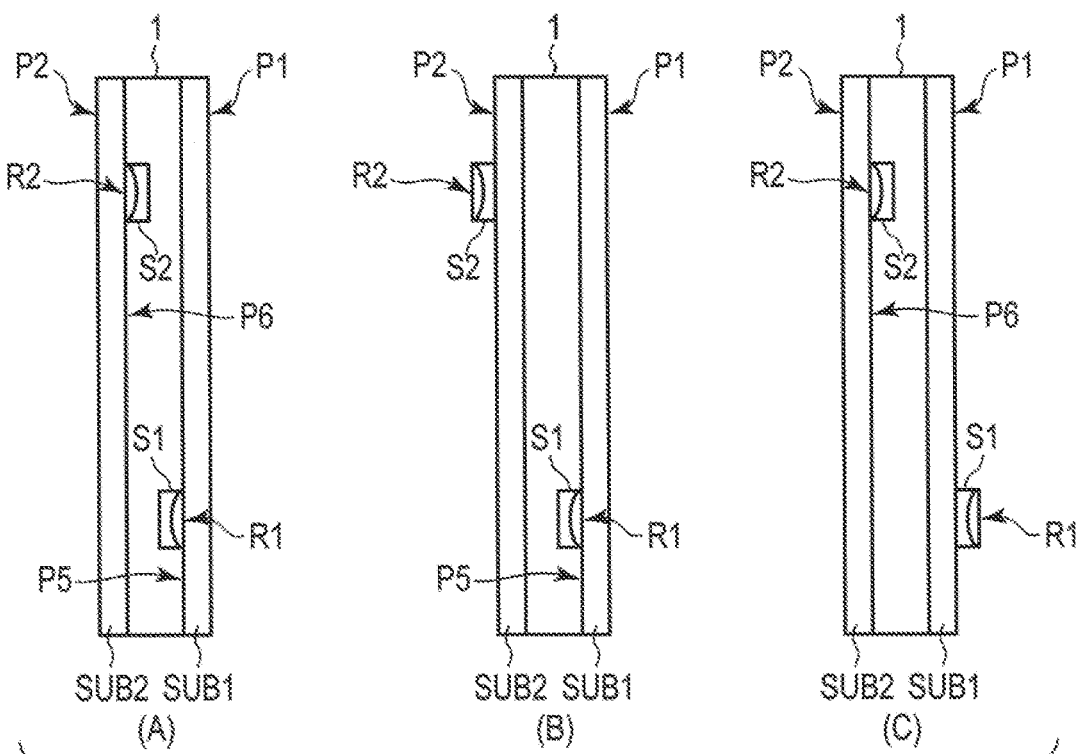
FIG. 7 is a drawing for explaining yet another installation position of each of the first optical sensor S1 and the second optical sensor S2.

FIG. 7 is a drawing for explaining yet another installation position of each of the first optical sensor S1 and the second optical sensor S2. Examples illustrated in FIG. 7 are different from the examples illustrated in FIG. 6 in that the first optical sensor S1 and the second optical sensor S2 are provided on different substrates, respectively.

In the example illustrated in FIG. 7(A), the first optical sensor S1 is provided on the inner surface P5 of the first substrate SUB1, and the second optical sensor S2 is provided on an inner surface P6 of the second substrate SUB2. In the example illustrated in FIG. 7(B), the first optical sensor S1 is provided on the inner surface P5 of the first substrate SUB1, and the second optical sensor S2 is provided on the outer surface P2 of the second substrate SUB2. In the example illustrated in FIG. 7(C), the first optical sensor S1 is provided on the outer surface P1 of the first substrate SUB1, and the second optical sensor S2 is provided on the inner surface P6 of the second substrate SUB2.

Figure 8:
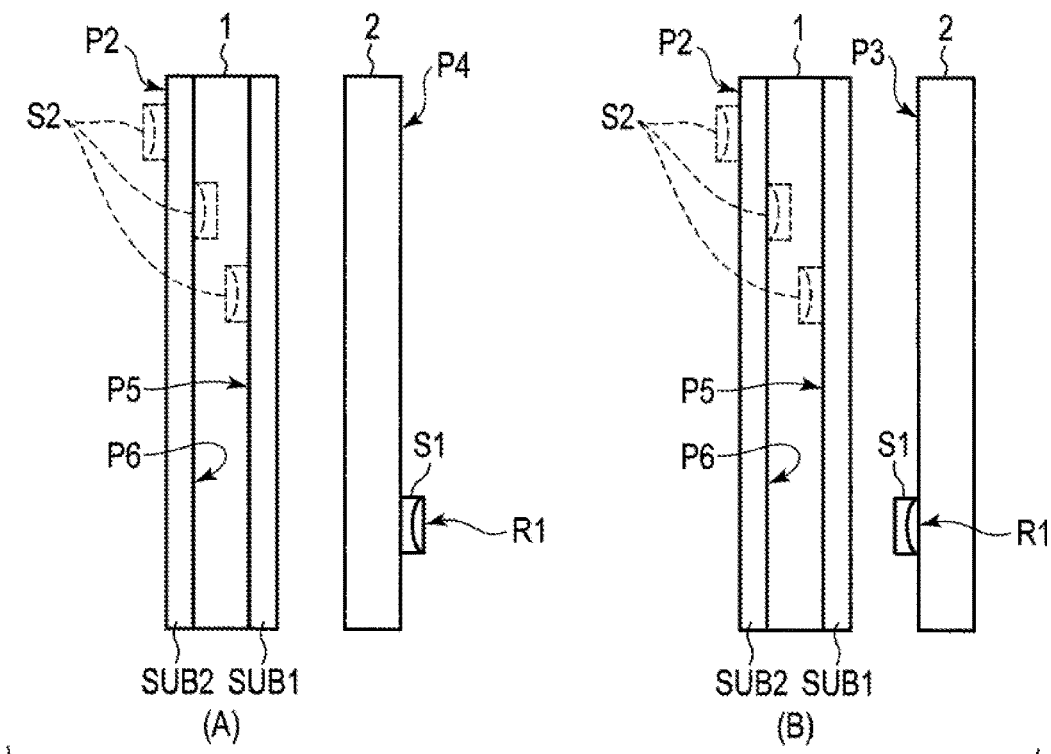
FIG. 8 is a drawing for explaining yet another installation position of each of the first optical sensor S1 and the second optical sensor S2.

FIG. 8 is a drawing for explaining yet another installation position of each of the first optical sensor S1 and the second optical sensor S2. Examples illustrated in FIG. 8 are different from the examples illustrated in FIGS. 6 and 7 in that the first optical sensor S1 is provided on the light-modulating element 2.

In the example illustrated in FIG. 8(A), the first optical sensor S1 is provided on the outer surface P4 of the light-modulating element 2. In the example illustrated in FIG. 8(B), the first optical sensor S1 is provided on the outer surface P3 of the light-modulating element 2. In either of the examples illustrated in FIG. 8, the second optical sensor S2 may be provided on any of the inner surface P5 of the first substrate SUB1, the inner surface P6 of the second substrate SUB2, and the outer surface P2 of the second substrate SUB2, as depicted by dotted lines in the drawing.

Next, a configuration example of the light-modulating element 2 in the display device DSP of the present embodiment will be described. As will be described below, the light-modulating element 2 comprises a transmittance variable element having the function of varying the transmittance, on the basis of control by the controller 3. The transmittance variable element is configured to switch between a first mode corresponding to a low transmittance state in which the incident light is absorbed, scattered, or reflected and a second mode corresponding to a high transmittance state in which the incident light is transmitted.

Figure 9:
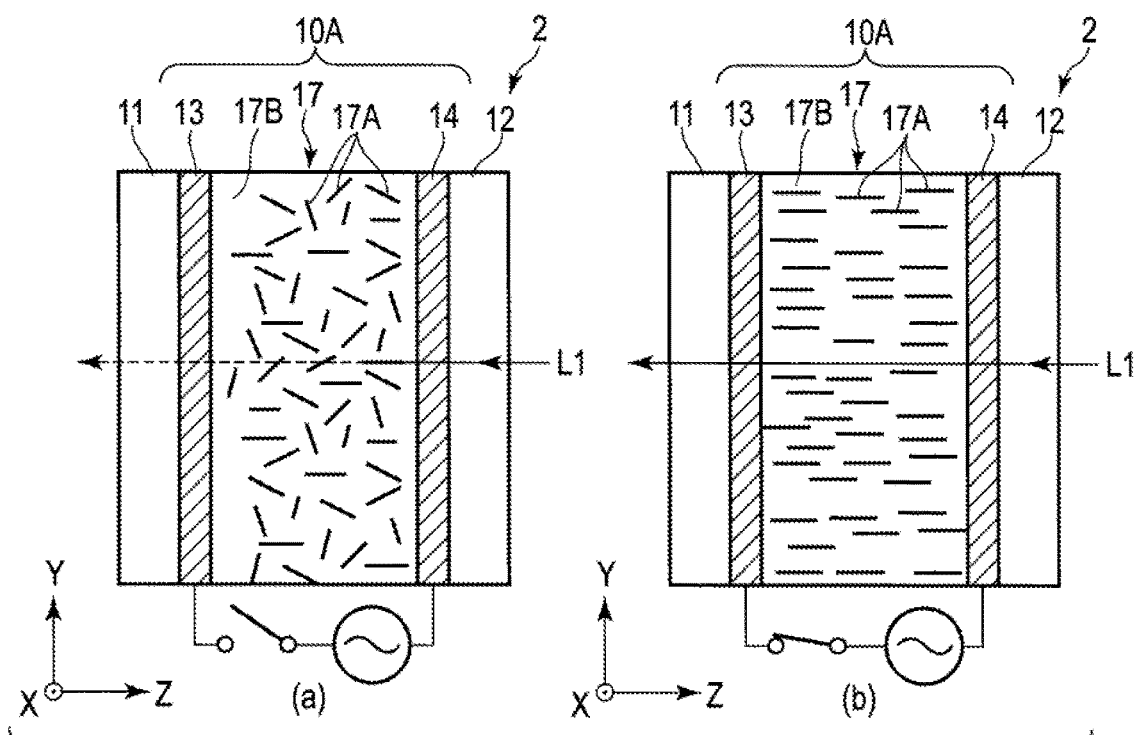
FIG. 9 is a drawing showing one configuration example of a light-modulating element 2.

FIG. 9 is a drawing showing one configuration example of the light-modulating element 2. The light-modulating element 2 which has been illustrated comprises a suspended particle device IDA as the transmittance variable element. FIG. 9(a) is a cross-sectional view of the suspended particle device 10A controlled in the first mode, and FIG. 9(b) is a cross-sectional view of the suspended particle device IDA controlled in the second mode.

The light-modulating element 2 comprises support substrates 11 and 12, a control electrode (a first electrode) 13, a control electrode (a second electrode) 14, and a modulation layer 17. The suspended particle device 10A is constituted of a pair of control electrodes 13 and 14, and the modulation layer 17. The control electrode 13 is located between the support substrate 11 and the modulation layer 17, and the control electrode 14 is located between the support substrate 12 and the modulation layer 17. The modulation layer 17 is located between the control electrode 13 and the control electrode 14. Each of the support substrates 11 and 12 is a substrate such as a glass substrate or a resin substrate, which is transparent to visible light. Each of the control electrodes 13 and 14 is formed of a transparent conductive material such as indium tin oxide (ITO) or indium zinc oxide (IZO). The modulation layer 17 is, for example, a suspension, and contains particles 17A and a dispersion medium 17B. The particle 17A has optical anisotropy, and has absorbency of more strongly absorbing a polarization component which oscillates in a long-axis direction of a molecule as compared to a polarization component which oscillates in a short-axis direction of the molecule.

As shown in FIG. 9(*a*), the first mode corresponds to the off-state in which no voltage is applied to the control electrodes 13 and 14 which are opposed to each other with the modulation layer 17 interposed therebetween. In this state, since an electric field is not applied to the modulation layer 17, the particles 17A form a disordered alignment state by the Brownian movement. Accordingly, the light L1 which is incident on the suspended particle device 10A is absorbed, scattered, or reflected by the particles 17A in the modulation layer 17. Thereby, most of the light L1 incident on the suspended particle device 10A is shielded, and the low transmittance state is obtained.

Meanwhile, as shown in FIG. 9(*b*), the second mode corresponds to the on-state in which a voltage is applied to the control electrodes 13 and 14. In this state, an electric field along the third direction Z is produced between the control electrodes 13 and 14 in the modulation layer 17. Accordingly, the particles 17A are aligned to conform to a direction of the electric field by dielectric polarization, etc. In the example illustrated, the particles 17A are aligned such that their long axes are parallel to the third direction Z. Consequently, the light L1 incident on the suspended particle device 10A passes through the light-modulating element 2 almost without being affected by the particles 17A in the modulation layer 17. Thereby, most of the light L1 incident on the suspended particle device 10A is transmitted, and the high transmittance state is obtained. Note that the alignment state of the particles 17A varies depending on the voltage applied to the control electrodes 13 and 14, and the transmittance of the suspended particle device 10A is controllable by the alignment state of the particles 17A.

FIG. 10 is a drawing showing another configuration example of the light-modulating element 2. The light-modulating element 2 which has been illustrated comprises a guest-host liquid crystal element 10B as the transmittance variable element. FIG. 10(*a*) is a cross-sectional view of the guest-host liquid crystal element 10B controlled in the second mode, and FIG. 10(*b*) is a cross-sectional view of the guest-host liquid crystal element 10B controlled in the first mode.

The light-modulating element 2 comprises the support substrates 11 and 12, the control electrode (the first electrode) 13, the control electrode (the second electrode) 14, alignment films 15 and 16, and the modulation layer 17. The alignment film 15 is located between the control electrode 13 and the modulation layer 17, and the alignment film 16 is located between the control electrode 14 and the modulation layer 17. The guest-host liquid crystal element 10B is constituted of a pair of control electrodes 13 and 14, a pair of alignment films 15 and 16, and the modulation layer 17. The modulation layer 17 is a guest-host liquid crystal layer. The modulation layer 17 includes dyes (for example, dichroic dyes) 17G having anisotropy in the visible light absorbency (absorptivity) as quest molecules, and liquid crystal molecules 17H of a nematic liquid crystal as host molecules. The dyes have absorbency of more strongly absorbing a polarization component which oscillates in a long-axis direction of a molecule as compared to a polarization component which oscillates in a short-axis direction of the molecule. In such a modulation layer 17, the dyes can be aligned in a desired direction in accordance with the alignment of the liquid crystal. Note that for the modulation layer 17, either of a structure having positive dielectric anisotropy and a structure having negative dielectric anisotropy can be applied. As the alignment films 15 and 16, a horizontal alignment film having the alignment restriction force of aligning the liquid crystal molecules 17H in a direction parallel to a main surface, or a vertical alignment film having the alignment restriction force of aligning the liquid crystal molecules 17H in a direction parallel to a normal line of the main surface may be applied. The main surface corresponds to a plane parallel to the X-Y plane.

In the following, a structure in which the modulation layer 17 has the negative dielectric anisotropy, and each of the alignment films 15 and 16 is a vertical alignment film will be described as an example.

As shown in FIG. 10(*a*), the first mode corresponds to the off-state in which no voltage is applied to the control electrodes 13 and 14 which are opposed to each other with the modulation layer 17 interposed therebetween. In this state, the liquid crystal molecules 17H and the dyes 17G in the modulation layer 17 are initially aligned in the third direction Z parallel to the normal line of the main surface. In this case, the dyes 17G hardly absorbs a first polarization component parallel to the first direction X, and a second polarization component parallel to the second direction Y of the light L1 incident on the modulation layer 17 along the third direction Z. Even if part of the light is absorbed by the ayes 17G, capability of absorbing the first polarization component and capability of absorbing the second polarization component are substantially the same. Thereby, most of the light L1 incident on the guest-host liquid crystal element 10B is transmitted, and a high transmittance state is obtained.

As shown in FIG. 10(*b*), the second mode corresponds to the on-state in which a voltage is applied to the control electrodes 13 and 14. In this state, an electric field along the third direction Z is produced between the control electrodes 13 and 14 in the modulation layer 17. Note that the electric field should preferably include an inclined electric field which is inclined with respect to the third direction Z. Such an inclined electric field can be formed by providing a protrusion between, for example, the support substrate 11 and the modulation layer 17, and between the support substrate 12 and the modulation layer 17, and providing a slit in the control electrodes 13 and 14. These protrusions and slits may be referred to as an inclined electric field forming portion. Alternatively, an effect similar to the inclined electric field can be brought about by forming a pre-tilt of liquid crystal molecules by performing rubbing treatment, etc., on the vertical alignment film in advance, and restricting the direction of tilt of the modulation layer 17 by a longitudinal electric field formed between the control electrodes 13 and 14. The liquid crystal molecules 17H and the dyes 17G in the modulation layer 17 are aligned such that the long axes of the liquid crystal molecules 17H and the dyes 17G are oriented in a direction intersecting the electric field. In other words, the liquid crystal molecules 17H and the dyes 17G are aligned to be oriented in a direction parallel to the X-Y plane. In the example illustrated, the dyes 17G are aligned such that the long axes thereof are oriented in a direction parallel to the second direction Y, and of the light L1 incident on the modulation layer 17, the second polarization component is more strongly absorbed as compared to the first polarization component. In this way, about 50% of the light L1 incident on the guest-host liquid crystal element 10B is absorbed, and a low transmittance state is obtained. Note that the alignment state of the dyes 17G varies depending on the voltage applied to the control electrodes 13 and 14, and the transmittance of the guest-host liquid crystal element 10B can be controlled by the alignment state of the dyes 17G.

While a configuration example in which the light-modulating element 2 comprises a single guest-host liquid crystal element 10B has been described above, another guest-host liquid crystal element 10B may be provided in line with the illustrated guest-host liquid crystal element 10B in the third direction. The other guest-host liquid crystal element 10B is set in the second mode corresponding to the high transmittance state in the off-state, as in the state shown in FIG. 10(a). Meanwhile, in the on-state, the liquid crystal molecules 17H and the dyes 17G are aligned such that the long axes thereof are oriented in a direction parallel to the first direction X, and the other guest-host liquid crystal element 10B more strongly absorbs the first polarization component as compared to the second polarization component of the light incident on the modulation layer 17. In this way, by combining this guest-host liquid crystal element 10B with the guest-host liquid crystal element 10B shown in FIG. 10(b), most (about 100%) of the light L1 incident on the light-modulating element 2 can be absorbed, and a state of even lower transmittance can be obtained.

Alternatively, a structure in which the modulation layer 17 has the positive dielectric anisotropy, and each of the alignment films 15 and 16 is a horizontal alignment film can also be applied. In this case, the light-modulating element 2 is set in the first mode corresponding to the low transmittance state in the off-state, and is set in the second mode corresponding to the high transmittance state in the on-state.

In the above, in the second mode (high transmittance state), the more the dyes 17G are aligned in a direction parallel to the normal line of the main surface, the more the transmittance is enhanced. That is, in terms of improving the transparency, it is more preferable to align the dyes 17G with the alignment restriction force of the vertical alignment film in the off-state as shown in FIG. 10(a), as compared to the case of aligning the dyes 17G with the electric field in the on-state. This is because changing the alignment of the dyes 17G near the surface of the alignment film by the voltage is not easy, and there may be a practical restriction on the voltage to be applied, and moreover, the optical properties are less likely to be affected by the fluctuations of the liquid crystal.

FIG. 11 is a drawing showing yet another configuration example of the light-modulating element 2. The light-modulating element 2 which has been illustrated comprises an electrochemical reaction element 10C as the transmittance variable element.

The light-modulating element 2 comprises the support substrates 11 and 12, the control electrode (the first electrode) 13, the control electrode (the second electrode) 14, and the modulation layer 17. The electrochemical reaction element 10C is constituted of a pair of control electrodes 13 and 14, and the modulation layer 17. The modulation layer 17 is an electrolyte layer. As the electrochemical reaction element 10C, an electrochromic element or an electrodeposition element may be used.

When the electrochemical reaction element 10C is an electrochromic element, the modulation layer 17 is constituted of an electrolyte layer containing an electrochromic dye. The electrochromic dye is classified into, for example, an oxidized dye and a reduced dye. The oxidized dye is one which is decolored by an electrochemical reduction reaction, and which develops color by an oxidation reaction. The reduced dye is one which is decolored by an electrochemical oxidation reaction, and which develops color by a reduction reaction. Note that the development of color is intended as a state of having an absorption peak in a visible light wavelength region. Accordingly, the light incident on the electrochemical reaction element 10C is absorbed by the electrochromic dye in the modulation layer 17. Thereby, at least part of the light incident on the electrochemical reaction element 10C is shielded, and a low transmittance state (first mode) is obtained. Meanwhile, the decoloring refers to a substantially transparent state. Accordingly, most of the light incident on the electrochemical reaction element 10C passes through the modulation layer 17, and a high transmittance state (second mode) is obtained.

When the electrochemical reaction element 10C is an electrodeposition element, the modulation layer 17 is constituted of an electrolyte layer containing silver or a compound including silver in a chemical structure. In one example, when a negative voltage greater than or equal to a threshold is applied to the modulation layer 17, electrons are injected into the modulation layer 17 from the control electrode 13, and silver is reduced and deposited on the control electrode 13. Accordingly, most of the light incident on the electrochemical reaction element 10C is shielded by silver deposited on the modulation layer 17, and a low transmittance state (first mode) is obtained. Meanwhile, when a positive voltage greater than or equal to a threshold is applied to the modulation layer 17, silver deposited on the control electrode 13 is oxidized and is changed into silver ions, which are dissolved in the modulation layer 17. Accordingly, most of the light incident on the electrochemical reaction element 10C passes through the modulation layer 17, and a high transmittance state (second mode) is obtained.

Next, a configuration example of the control electrodes 13 and 14 applicable to the above-described transmittance variable element 10 will be described.

Figure 12:
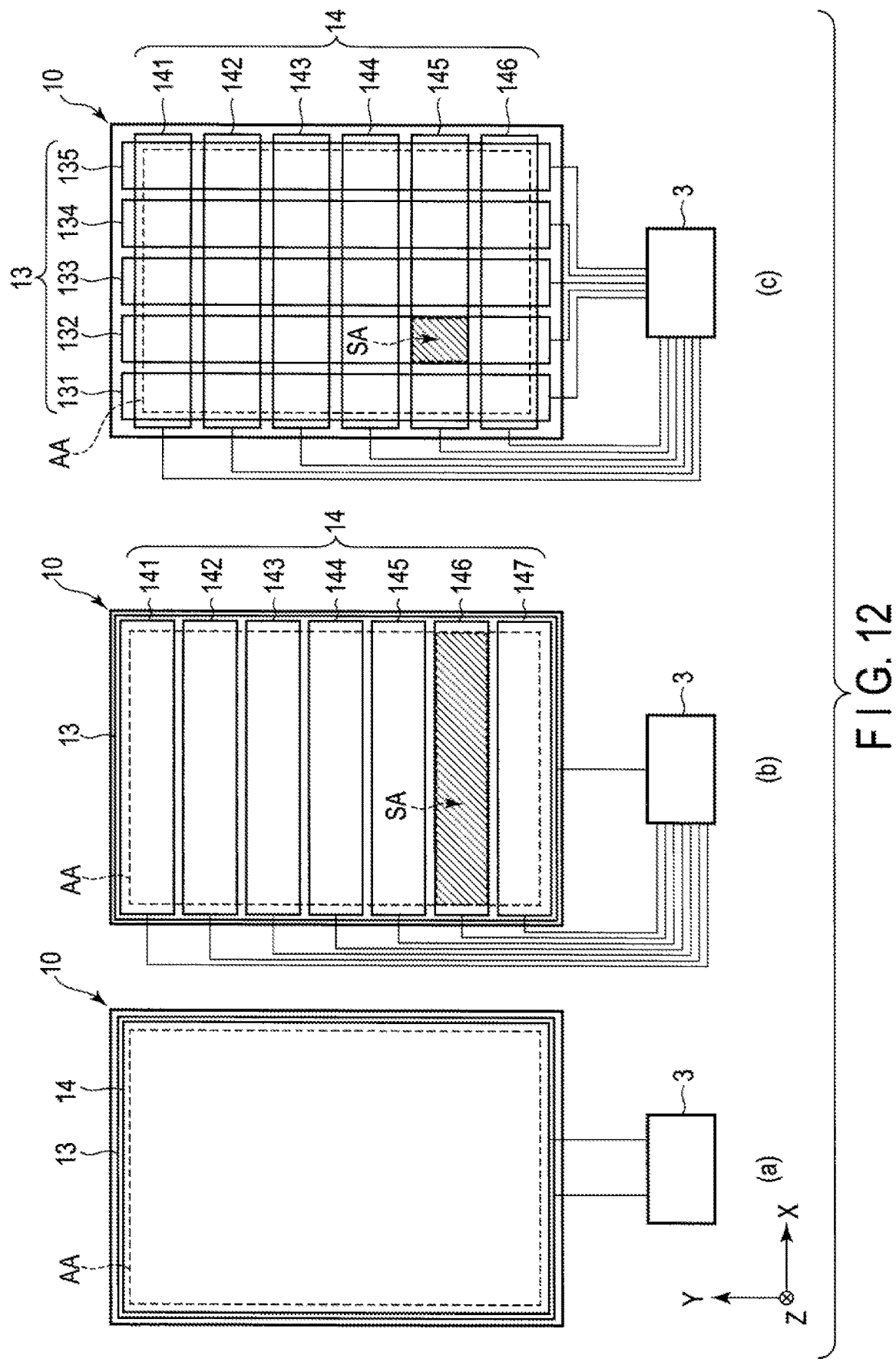
FIG. 12 is a plan view showing a configuration example of control electrodes 13 and 14.

FIG. 12 is a plan view showing the configuration example of the control electrodes 13 and 14. The transmittance variable element 10 includes an effective area AA through which light can pass in the X-Y plane. In one example, the effective area AA is formed in a rectangular shape having short sides along the first direction X and long sides along the second direction Y. However, the shape is not limited to the illustrated example, and the effective area AA may have the other shape such as polygonal, or may be circular or elliptical, for example.

In the configuration example illustrated in FIG. 12(a), each of the control electrodes 13 and 14 is constituted of a single sheet electrode extending over the entire surface of the effective area AA without having intermittence. As described above, the control electrodes 13 and 14 are opposed to each other with the modulation layer 17 interposed therebetween. The controller 3 is electrically connected to each of the control electrodes 13 and 14. In such a configuration example, as the controller 3 controls the voltage to be applied to the control electrodes 13 and 14, the transmittance of the modulation layer 17 is controlled on the entire surface of the effective area AA. Thereby, the transmittance variable element 10 can control the first mode (low transmittance state mode) and the second mode (high transmittance state mode) on the entire surface of the effective area AA.

The configuration example illustrated in FIG. 12(b) is different from the configuration example illustrated in FIG. 12(a) in that the effective area AA of the transmittance variable element 10 includes strip-shaped multiple sub-areas SA. The control electrode 13 is constituted of a single sheet electrode as in the configuration example illustrated in FIG. 12(a). The control electrode 14 is constituted of a plurality of strip electrodes 141 to 147 which are spaced apart from each other. In the example illustrated, the strip electrodes 141 to 147 are each formed in a rectangular shape extending in the first direction X, and are arranged to be spaced apart from each other in the second direction Y. The control electrode 13 and the strip electrodes 141 to 147 are opposed to each other. The controller 3 is electrically connected to the control electrode 13, and also to each of the strip electrode 141 to 147. Each of the sub-areas SA corresponds to an overlapping portion where the control electrode 13 and one of the strip electrodes 141 to 147 overlap each other in the X-Y plane. In other words, in the example illustrated, each sub-area SA is a strip-shaped area extending in the first direction X.

Note that the strip electrodes 141 to 147 may each extend in the second direction Y, and be arranged to be spaced apart from each other in the first direction X. Further, the configuration example illustrated in the drawing corresponds to a case where one of the control electrodes 13 and 14 is constituted of a sheet electrode, and the other control electrode is constituted of the strip electrodes. Thus, the control electrode 13 may be constituted of a plurality of strip electrodes, and the control electrode 14 may be constituted of a single sheet electrode.

In such a configuration example, as the controller 3 controls the voltage to be applied to the strip electrodes 141 to 147 individually, the transmittance is controlled in each of the sub-areas SA. In this way, the transmittance variable element 10 can control the first mode and the second mode for each of the sub-areas SA. Note that as the transmittance variable element 10 of this configuration example drives all of the strip electrodes 141 to 147 together, the first mode and the second mode can be controlled on the entire surface of the effective area AA.

The configuration example illustrated in FIG. 12(c) is different from the configuration example illustrated in FIG. 12(a) in that the effective area AA of the transmittance variable element 10 includes multiple sub-areas SA arrayed in a matrix. The control electrode 13 is constituted of a plurality of strip electrodes 131 to 135 which are spaced apart from each other. The control electrode 14 is constituted of a plurality of strip electrodes 141 to 146 which are spaced apart from each other. In the example illustrated, the strip electrodes 131 to 135 each extend in the second direction Y, and are spaced apart from each other in the first direction X. Also, the strip electrodes 141 to 146 each extend in the first direction X, and are spaced apart from each other in the second direction Y. The strip electrodes 131 to 135 and the strip electrodes 141 to 146 are opposed to each other. The controller 3 is electrically connected to each of the strip electrodes 131 to 135, and each of the strip electrodes 141 to 146. Each of the sub-areas SA corresponds to a rectangular crossover portion where one of the strip electrodes 131 to 135 and one of the strip electrodes 141 to 146 cross each other in the X-Y plane. In other words, in the example illustrated, the sub-areas SA are arrayed in a matrix in the first direction X and the second direction Y.

In such a configuration example, as the controller 3 controls the voltage to be applied to the strip electrodes 131 to 135 and the strip electrodes 141 to 146 individually, the transmittance is controlled in each of the sub-areas SA. In this way, the transmittance variable element 10 can control the first mode and the second mode for each of the sub-areas SA. Mote that as the transmittance variable element 10 of this configuration example drives all of the strip electrodes 131 to 135 and the strip electrodes 141 to 146 together, the first mode and the second mode can be controlled on the entire surface of the effective area AA.

In the above configuration example, the shape of the sub-area SA is not limited to a rectangle. That is, the sub-area SA may be formed in an arbitrary shape such as any other polygonal shape, or a circular or elliptical shape, for example. The shapes of the control electrodes 13 and 14 which define the shape of the sub-area SA can be selected freely.

Figure 13:
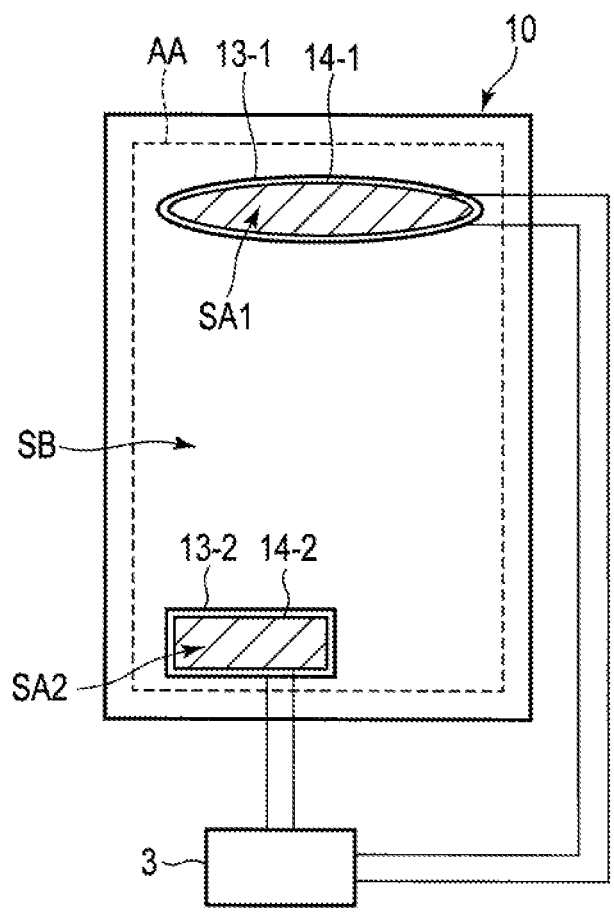
FIG. 13 is a plan view showing another configuration example of the control electrodes 13 and 14.

FIG. 13 is a plan view showing another configuration example of the control electrodes 13 and 14. The configuration example illustrated in FIG. 13 is different from the configuration examples illustrated in FIG. 12 in that a sub-area SA1 and a sub-area SA2 are formed locally in the effective area AA. In other words, the sub-areas SA do not need to be formed on the entire surface of the effective area AA as in the configuration examples shown in FIG. 12, but may be provided arbitrarily in regions where control of the transmittance is necessary.

In the example illustrated, in the effective area AA, the sub-area SA1 is an elliptical area, which is formed in a region where a pair of control electrodes 13-1 and 14-1 are opposed to each other, and the sub-area SA2 is a rectangular area, which is formed in a region where a pair of control electrodes 13-2 and 14-2 are opposed to each other. In this structure, of the effective area AA, while the first mode and the second mode can be controlled in the sub-areas SA1 and SA2, the second mode is maintained in an area SB excluding the sub-areas SA, where most of the light is transmitted. That is, the area SB corresponds to a transmissive region. In one example, when the above configuration example is compared with the configuration example shown in FIGS. 4 and 5, the sub-areas SA1 and SA2 correspond to the third area A3 where the transmittance is variable, and the area SB corresponds to the fourth area A4 where the transmittance is constant.

Note that in the configuration examples shown in FIGS. 12 and 13, although each of the sub-areas SA of the transmittance variable element 10 is driven by a passive method, an active method may alternatively be employed. That is, the transmittance variable element 10 may comprise an active device for each sub-area SA, and at least one of the control electrodes 13 and 14 may be electrically connected to the active device. In this case, the first mode and the second mode can be controlled independently for each of the sub-areas SA.

Next, a configuration example of the display panel 1 in the display device DSP of the present embodiment will be described.

Figure 14:
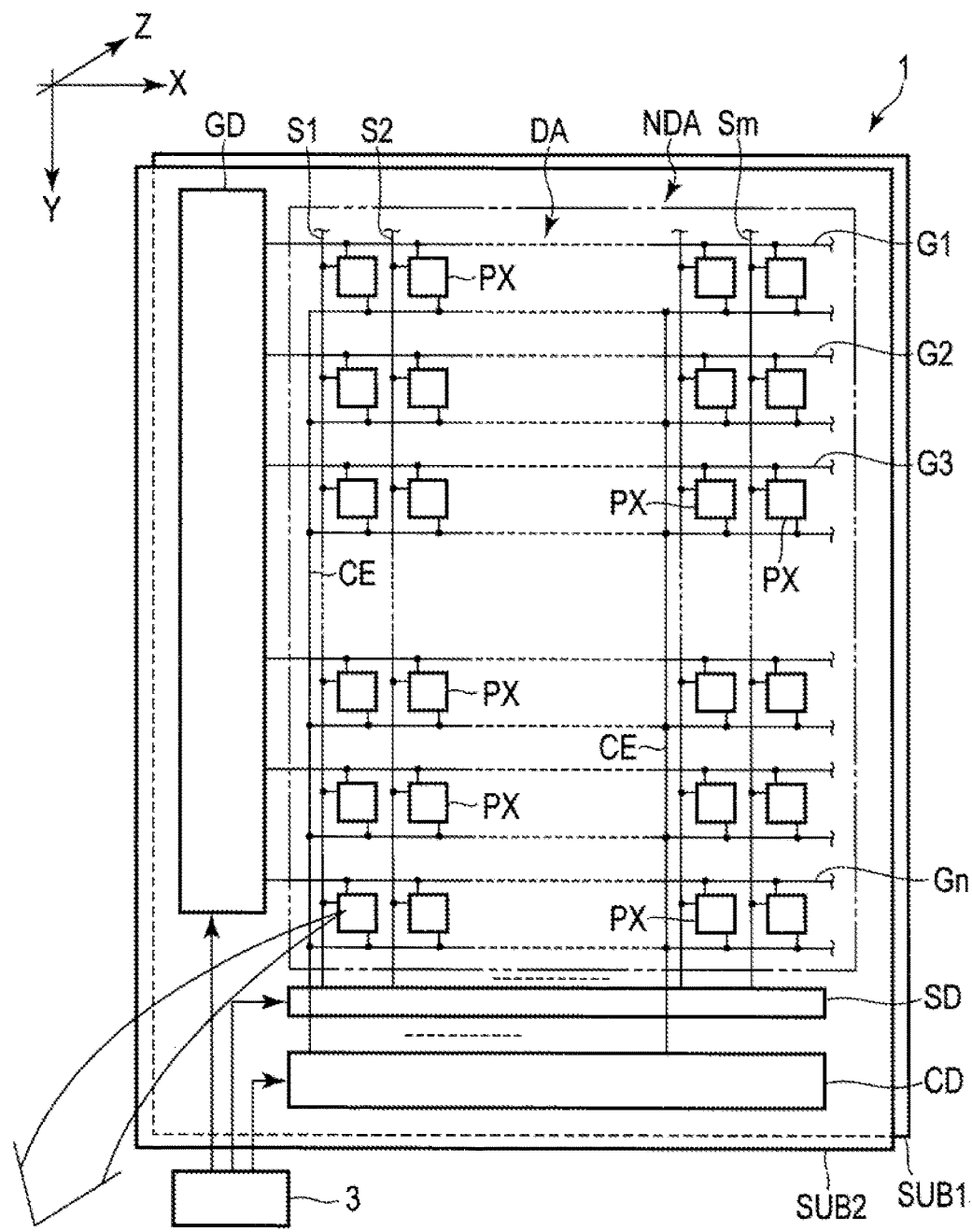
FIG. 14 is an illustration showing a basic structure and an equivalent circuit of a display panel 1.
Figure 14:
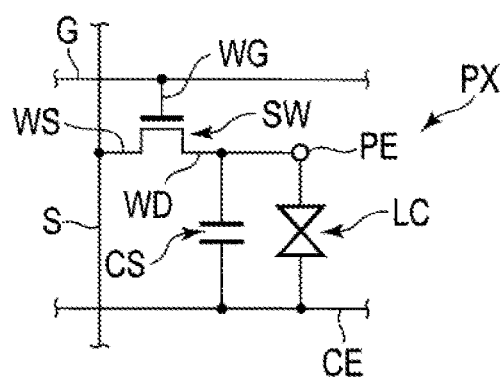

FIG. 14 is an illustration showing a basic structure and an equivalent circuit of the display panel 1. Here, a liquid crystal display panel will be described as an example of the display panel 1.

The display panel 1 includes a display area DA where an image is displayed. The display area DA comprises a plurality of pixels PX. Here, the pixel indicates a minimum unit which can be individually controlled in accordance with a pixel signal, and exists in, for example, an area including a switching element arranged at a position where a scanning line and a signal line, which will be described later, cross each other. The pixels PX are arrayed in a matrix in the first direction X and the second direction Y. Also, the first substrate SUB1 includes scanning lines (also referred to as gate lines) G (G1 to Gn), signal lines (also referred to as data lines or source lines) S (S1 to Sm), a common electrode CE, etc., in the display area DA. The scanning lines G extend in the first direction X, and are arranged in the second direction Y. The signal lines S extend in the second direction Y, and are arranged in the first direction X. Since the scanning lines G and the signal lines S are formed of an opaque metal material, from the standpoint of improving the transmittance of the display panel 1, they should preferably be formed as thin as possible. Also, from the standpoint of reducing the effect of light reflected by the scanning lines G and the signal lines S on a display image, an antireflective treatment should preferably be performed on a surface of each of the scanning lines G and the signal lines S. Note that the scanning lines G and the signal lines S do not necessarily extend linearly, and may be partially bent. The common electrode CE is disposed over the pixels PX. The scanning lines G are connected to a scanning line drive circuit GD, the signal lines S are connected to a signal line drive circuit SD, and the common electrode CE is connected to a common electrode drive circuit CD. The scanning line drive circuit GD, the signal line drive circuit SD, and the common electrode drive circuit CD are controlled by the controller 3.

Each of the pixels PX comprises a switching element SW, a pixel electrode PE, the common electrode CE, a liquid crystal layer LC, and the like. The switching element SW is constituted by a thin-film transistor (TFT), for example, and is electrically connected to the scanning line G and the signal line S. More specifically, the switching element SW includes a gate electrode WG, a source electrode WS, and a drain electrode WD. The gate electrode WG is electrically connected to the scanning ling G. In the example illustrated, the electrode electrically connected to the signal line S is referred to as the source electrode WS, and the electrode electrically connected to the pixel electrode PE is referred to as the drain electrode WD. The scanning line G is connected to the switching elements SW of the respective pixels PX arranged in the first direction X. The signal line S is connected to the switching elements SW of the respective pixels PX arranged in the second direction Y.

For the switching element SW, either a top-gate switching element or a bottom-gate switching element may be applied, and also, either a single-gate structure or a double-gate structure may be applied. Further, amorphous silicon, polycrystalline silicon, an oxide semiconductor layer, and the like, may be applied to a semiconductor layer provided in the switching element SW. From the standpoint of reducing leakage caused by light incident on the semiconductor layer, the semiconductor layer should preferably be formed by an oxide semiconductor. Also, from the standpoint of improving the transmissivity of the display panel 1, the semiconductor layer should preferably be formed of a transparent oxide semiconductor.

The pixel electrode PE is electrically connected to the switching element SW. The common electrode CE is opposed to a plurality of pixel electrodes PE. The pixel electrode PE and the common electrode CE function as drive electrodes which drive the liquid crystal layer LC. The pixel electrode PE and the common electrode CE are formed of a transparent conductive material such as ITO or IZO. From the standpoint of improving the transmissivity of the display panel 1, preferably, the pixel electrode PE and the common electrode CE should not contain opaque metal material. A storage capacitance CS is formed between, for example, the common electrode CE and the pixel electrode PE.

Note that while a case where each of the pixels PX is driven by an active method has been described, the pixels PX may be driven by a passive method.

Figure 15:
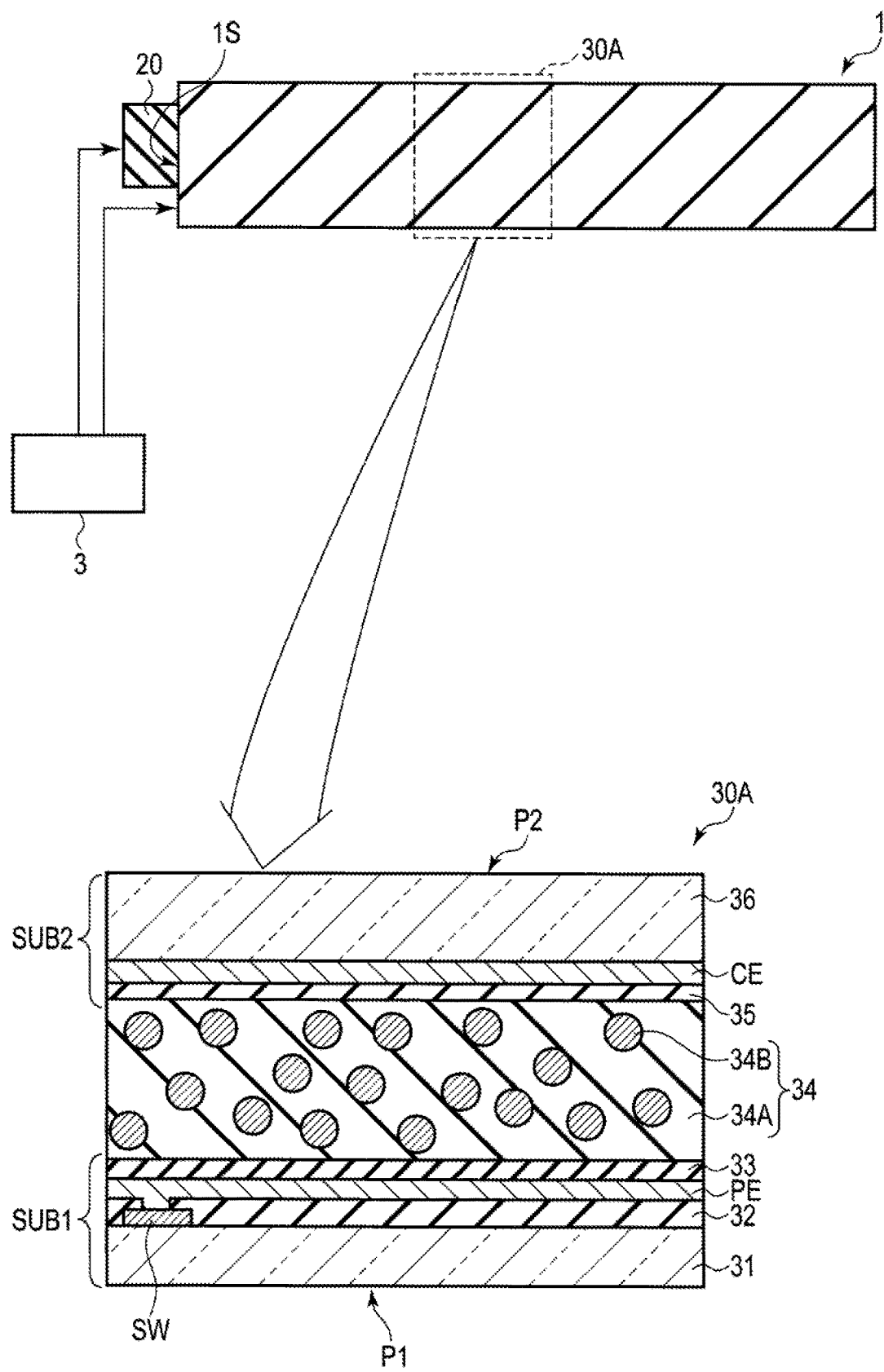
FIG. 15 is an illustration showing a configuration example of the display panel 1.

FIG. 15 is an illustration showing a configuration example of the display panel 1. The illustrated display panel 1 comprises a polymer dispersed liquid crystal element (hereinafter simply referred to as a liquid crystal element) 30A as the above-described display element DE. A light source 20 is arranged on a side surface 1S of the display panel 1. The side surface 1S corresponds to an incident surface on which light from the light source 20 is incident. The display panel 1 and the light source 20 are controlled by the controller 3. A liquid crystal element 30A shown by a dotted line in the drawing will be described more specifically in enlarged scale.

The display panel 1 comprises the first substrate SUB1, the second substrate SUB2, and a light-modulating layer 34. The first substrate SUB1 comprises a first insulating substrate 31 having the outer surface P1, the switching element SW, an insulating film 32, the pixel electrode PE, a first alignment film 33, etc. The first substrate SUB1 also comprises the above-mentioned scanning lines, signal lines, etc. The second substrate SUB2 comprises a second insulating substrate 36 having the outer surface P2, the common electrode CE, a second alignment film 35, etc. The light-modulating layer 34 is located between the first alignment film 33 and the second alignment film 35. The liquid crystal element 30A is constituted of the pixel electrode PE, the first alignment film 33, the light-modulating layer 34, the common electrode CE, and the second alignment film 35.

The first insulating substrate 31 and the second insulating substrate 36 are substrates which are transparent to visible light, and are, for example, a glass substrate or a resin substrate.

In the example illustrated, the pixel electrode PE is located between the first insulating substrate 31 and the light-modulating layer 34, and the common electrode CE is located between the second insulating substrate 36 and the light-modulating layer 34. Alternatively, the pixel electrode PE may be located between the second insulating substrate 36 and the light-modulating layer 34, and the common electrode CE may be located between the first insulating substrate 31 and the light-modulating layer 34, or both of the pixel electrode PE and the common electrode CE may be located on the same substrate of either the first substrate SUB1 or the second substrate SUB2.

The first alignment film 33 and the second alignment film 35 are configured to align, for example, a polymer obtained by polymerizing a monomer and a liquid crystal used for the light-modulating layer 34. Examples of the alignment films include a vertical alignment film and a horizontal alignment film. It is sufficient if the first alignment film 33 and the second alignment film 35 as described above have a function of aligning the monomer in a predetermined direction when the monomer is polymerized. The monomer thereby becomes a polymer polymerized in such a state that the monomer is aligned in a predetermined direction. Also, the liquid crystal is aligned in a predetermined direction depending on the direction of alignment of the polymerized polymer. Note that the liquid crystal and the monomer used for the light-modulating layer 34 can also be aligned by applying an electric field between the pixel electrode PE and the common electrode CE or applying a magnetic field. Therefore, the first alignment film 33 and the second alignment film 35 may be omitted.

The light-modulating layer 34 is located between the first substrate SUB1 and the second substrate SUB2. The light-modulating layer 34 is a polymer dispersed liquid crystal layer, and corresponds to the liquid crystal layer LC shown in FIG. 14. Such a light-modulating layer 34 is constituted of a composite layer including a bulk 31A and fine particles 34B dispersed in the bulk 34A. The bulk 34A mainly contains a polymeric material (a polymer) obtained by polymerizing a liquid crystal monomer. The fine particles 34B mainly contain a liquid crystal material. Each of the bulk 34A and the fine particles 34B has optical anisotropy.

The bulk 34A and the fine particles 34B have substantially equivalent refractive anisotropy. In other words, the bulk 34A and the fine particles 34B are substantially equal to each other in their ordinary indexes and extraordinary indexes. Note that a deviation in the refractive index between the bulk 34A and the fine particles 34B caused by a manufacturing error, for example, is permissible. In one example, a difference in the ordinary index between the bulk 34A and the fine particles 34B should preferably be, for example, 0.1 or less, more preferably, 0.05 or less. Also, a difference in the extraordinary index between the bulk 31A and the fine particles 34B should preferably be, for example, 0.1 or less, more preferably, 0.05 or less. Also, a refractive index difference (=extraordinary index−ordinary index) of the bulk 34A and a refractive index difference (=extraordinary index−ordinary index) of the fine particles 34B should preferably be as large as possible, i.e., preferably, 0.05 or more, more preferably, 0.1 or more, and yet more preferably, 0.15 or more.

Meanwhile, the bulk 34A and the fine particles 34B are different in their responsiveness to the electric field, and the responsiveness to the electric field of the fine particles 34B is higher than that of the bulk 34A. The bulk 34A has, for example, a streaked structure or a porous structure which does not respond to the electric field, or has a rod-like structure having a response speed lower than that of the fine particles 34B.

The liquid crystal element 30A, which is the above display element DE, has a non-display mode in which light can be transmitted between the outer surface P1 and the outer surface P2, and a display mode in which the display light DL is emitted toward the outer surface P2.

Figure 16:
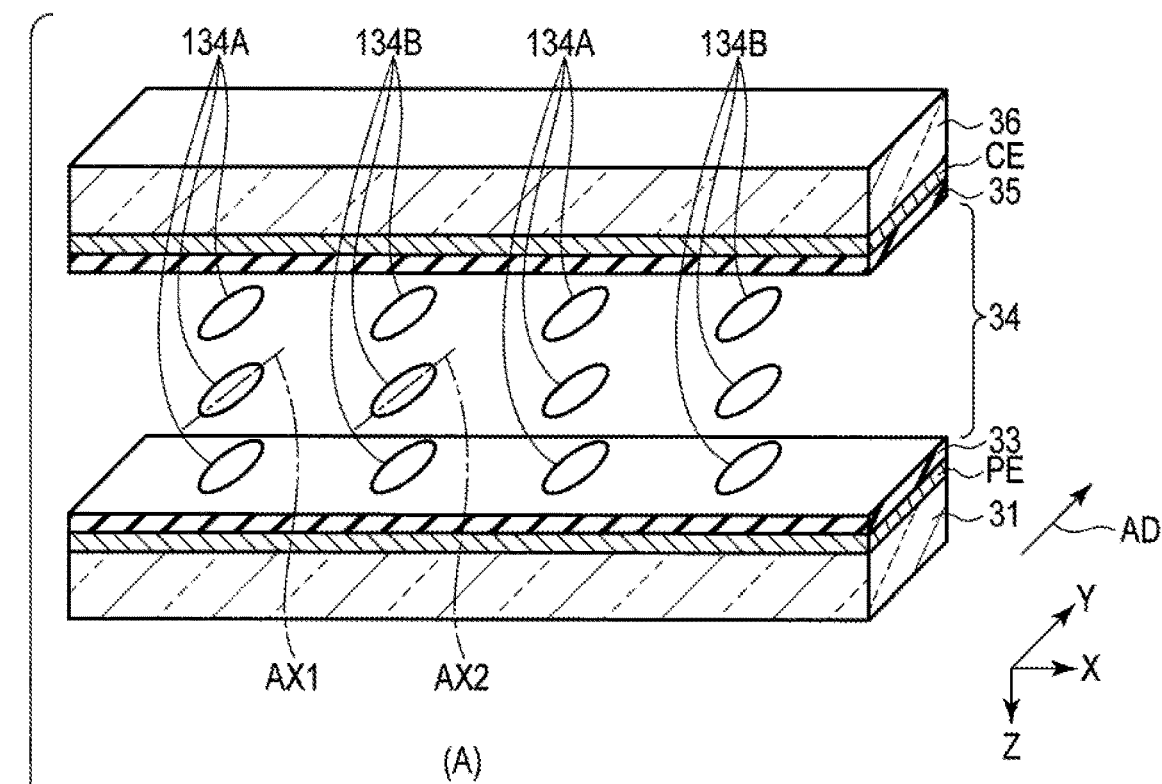
FIG. 16 is a drawing for explaining the operation of the display panel 1 shown in FIG. 15.
Figure 16:
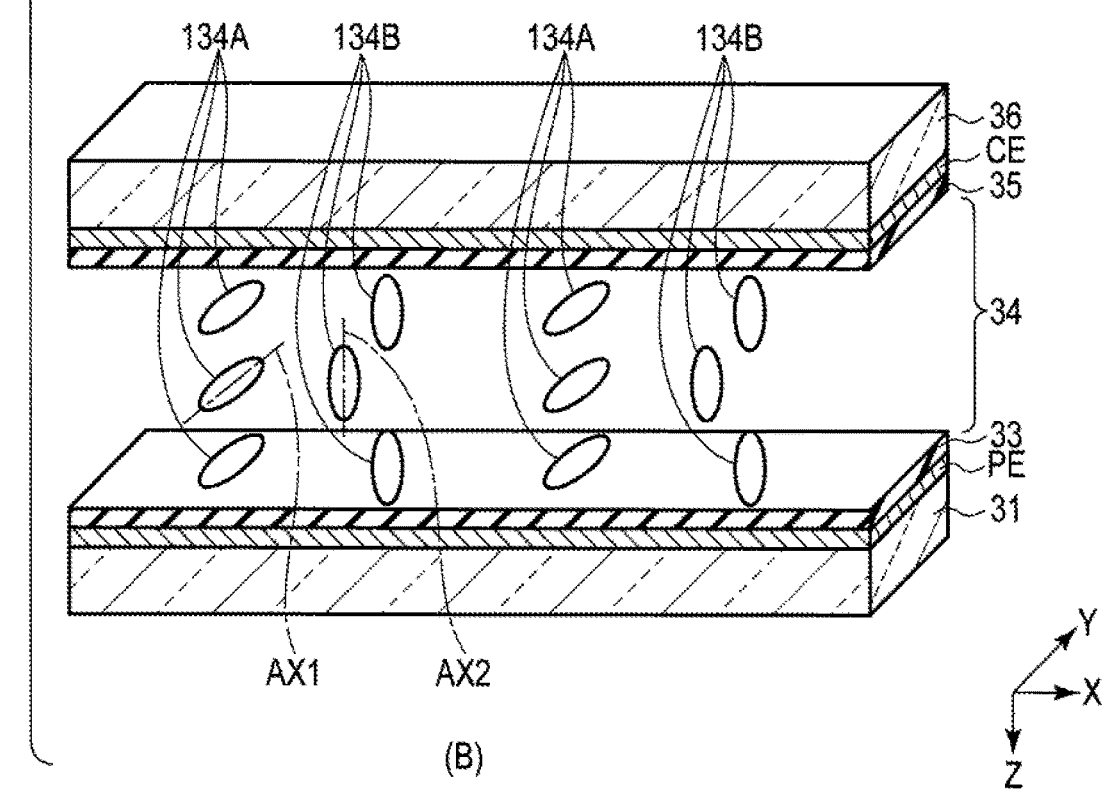

The operation of the display panel 1 will be described with reference to FIG. 16. Here, the first alignment film 33 and the second alignment film 35 are horizontal alignment films which align the monomer in an in-plane direction parallel to the X-Y plane, i.e., the horizontal direction, in a process of forming the polymer which constitutes the bulk 34A. Further, the liquid crystal material which constitutes the fine particles 34B is a positive liquid crystal having positive dielectric anisotropy.

FIG. 16(A) is an illustration which schematically shows the state in which no electric field is applied to the light-modulation layer 34 (i.e., the non-display mode). Ellipsoids 134A in the figure represent an example of index ellipsoids indicating the refractive anisotropy of the bulk 34A. Ellipsoids 134B in the figure represent an example of index ellipsoids indicating the refractive anisotropy of the fine particles 34B. These index ellipsoids represent the refractive index of the linearly polarized light entering from various directions with a tensor ellipsoid.

In the non-display mode, an optical axis of the bulk 34A (more specifically, a major axis of the ellipsoid 134A), i.e., AX1, is parallel to an optical axis of the fine particles 34B (more specifically, a major axis of the ellipsoid 134B), i.e., AX2. In the example illustrated, the optical axes AX1 and AX2 are substantially parallel to the second direction Y in the X-Y plane. As described above, the bulk 34A and the fine particles 34B have substantially equivalent refractive anisotropy, and the shapes of the ellipsoids 134A and 134B indicating their own refractive anisotropy are substantially the same. Further, since the optical axes AX1 and AX2 are parallel to each other in the non-display mode, there is hardly a refractive index difference between the bulk 34A and the fine particles 34B in all directions. Consequently, light from the light source 20 passes through the light-modulation layer 34 without being scattered in the light-modulation layer 34. That is, the pixel PX having the light-modulation layer 34 in a transmission state does not contribute to display. Thereby, in the non-display mode, the liquid crystal element 30 transmits light between the outer surface P1 and the outer surface P2.

In this mode, since the light-modulating element 2 is in the state of the first transmittance (high transmittance) in which light is transmitted between the outer surface P3 and the outer surface P4, the light L1 which proceeds toward the display device DSP passes through the light-modulating element 2, and further passes through the display panel 1, as shown in FIG. 2, etc.

FIG. 16(B) is an illustration which schematically shows the state in which an electric field is applied to the light-modulation layer 34 (i.e., the display mode).

In the display mode, the alignment state of the liquid crystal material which constitutes the fine particles 34B varies in accordance with the electric field. When the liquid crystal material is a positive liquid crystal, the liquid crystal material is aligned such that the major axis is substantially parallel to the electric filed formed in the light-modulation layer 34. Meanwhile, the alignment state of the polymeric material which constitutes the bulk 34A does not change whether or not an electric field is applied. That is, the optical axis AX1 of the ellipsoid 134A of the bulk 34A does not change irrespective of application of the electric field, and the optical axis AX2 of the ellipsoid 134B of the fine particles 34B changes in accordance with the electric field. In one example, the optical axis AX1 of the bulk 34A (the major axis AX1 of the ellipsoid 134A) intersects the optical axis AX2 of the fine particles 34B (the major axis AX2 of the ellipsoid 134B). In the example illustrated, the optical axis AX1 is substantially parallel to the second direction Y, which is the same as in the non-display mode. Further, the optical axis AX2 is substantially parallel to the third direction Z, which is different from the non-display mode. In the display mode as described above, since the optical axes AX1 and AX2 cross each other, a great refractive index difference is created between the bulk 34A and the fine particles 34B in all directions. Accordingly, the light from the light source 20 is scattered within the light-modulation layer 34, and passes through the second insulating substrate 36. In other words, the pixel PX having the light-modulation layer 34 in a scattering state emits display light which contributes to display. Thus, in the display mode, the liquid crystal element 30A emits the display light DL toward the outer surface P2, and light is hardly transmitted between the outer surface P1 and the outer surface P2.

In this mode, since the light-modulating element 2 is in the state of the second transmittance (low transmittance) lower than the first transmittance, as shown in FIG. 3A, etc., the light L1 which proceeds toward the display device DSP hardly passes through the light-modulating element 2 and does not reach the display panel 1. Therefore, the visibility of the display light DL can be improved.

With respect to the above display panel 1, the first alignment film 33 and the second alignment film 35 may be vertical alignment films, and the liquid crystal material which constitutes the fine particles 34B may be a negative liquid crystal having negative dielectric anisotropy.

In the above display panel 1, in order to realize color display, it is sufficient if the display panel 1 comprises color pixels which exhibit red, green, and blue, respectively, for example. In one example, the second substrate SUB2 comprises color filters colored red, green, and blue, respectively, between the second insulating substrate 36 and the common electrode CE. Also, from the standpoint of improving the transmissivity of the display panel 1, the display panel 1 may include a pixel which exhibits white or a transparent pixel.

Alternatively, also in a structure in which the light source 20 comprises point light sources which respectively emit red, green, and blue light, and one frame period is divided into a red subfield, a green subfield, and a blue subfield, color display is realized. That is, the display panel 1 is driven based on red image data in synchronization with lighting of only a red point light source in the red subfield, and thereafter, the display panel 1 is similarly driven based on green image data in synchronization with lighting of only a green point light source in the green subfield, and the display panel 1 is driven based on blue image data in synchronization with lighting of only a blue point light source in the blue subfield. When such a drive method is adopted, since the color filters can be eliminated from the display panel 1, and absorption by the color filters can be suppressed, the transmittance can be improved.

Figure 17:
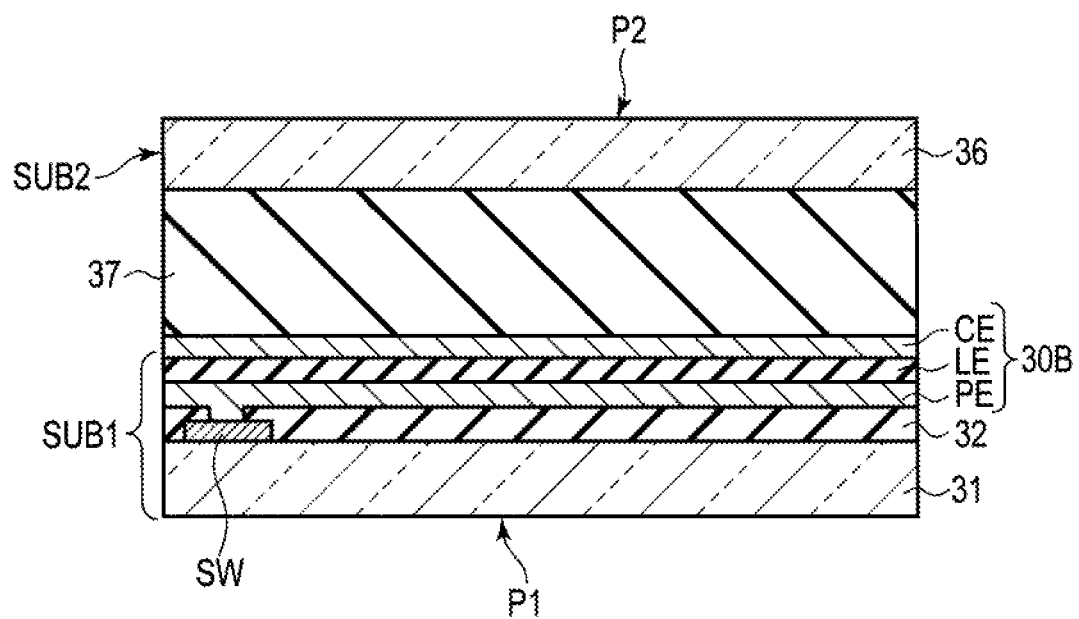
FIG. 17 is an illustration showing another configuration example of the display panel 1.

FIG. 17 is an illustration showing another configuration example of the display panel 1. The illustrated display panel 1 comprises an EL element 30B as the display element DE. The EL element 30B also has a non-display mode in which light can be transmitted between the outer surface P1 and the outer surface P2, and a display mode in which the display light DL is emitted toward the outer surface P2.

A basic structure of the EL element 30B comprises a light-emitting layer containing a luminous substance between a pair of electrodes, and light emission is obtained from the luminous substance by applying a voltage between the electrodes. As the luminous substance which develops electroluminescence, the EL element 30B can be categorized into an organic EL element which uses an organic compound, and an inorganic EL element which uses an inorganic compound.

In the example illustrated, the display panel 1 comprises the EL element 30B on the first substrate SUB1. The first substrate SUB1 comprises the first insulating substrate 31 having the outer surface P1, the switching element SW, the insulating film 32, the pixel electrode PE, a light-emitting layer LE, the common electrode CE, etc. The second substrate SUB2 comprises, for example, the second insulating substrate 36 having the outer surface P2. The EL element 30B is constituted of the pixel electrode PE, the light-emitting layer LE, and the common electrode CE. One of the pixel electrode PE and the common electrode CE serves as an anode, and the other one of the electrodes serves as a cathode.

The light-emitting layer LE may be formed of an emitting material which emits light of a single color such as red, green, or blue, or configured to emit white light, for example, by mixing multiple emitting materials. Furthermore, the light-emitting layer LE may include a functional layer such as a hole transport layer, a hole injection layer, an electron transport layer, or an electron injection layer as necessary. Also, the EL element 30B may be covered with a transparent barrier film for preventing entry of moisture, etc.

The first substrate SUB1 and the second substrate SUB2 are adhered to each other by a transparent adhesive 37.

In the above display panel 1, in order to realize color display, it is sufficient if the display panel 1 comprises the EL elements 30B which emits red light, green light, and blue light, respectively, for example.

Alternatively, while the first substrate SUB1 comprises the EL element 30B which emits white light, the second substrate SUB2 may include a color filter opposed to the EL element 30B.

As explained above, according to the present embodiment, a display device capable of suppressing deterioration in display quality can be provided.

The present invention is not limited to the embodiments described above but the constituent elements of the invention can be modified in various manners without departing from the spirit and scope of the invention. Various aspects of the invention can also be extracted from any appropriate combination of a plurality of constituent elements disclosed in the embodiments. Some constituent elements may be deleted in all of the constituent elements disclosed in the embodiments. The constituent elements described in different embodiments may be combined arbitrarily.

What is claimed is:

1. A display device comprising:
a display panel including a first outer surface and a second outer surface which is on a side opposite to the first outer surface, the display panel comprising a display element having a non-display mode in which light is transmitted between the first outer surface and the second outer surface, and a display mode in which display is made toward the second outer surface;
a light-modulating element including a third outer surface opposed to the first outer surface, and a fourth outer surface which is on a side opposite to the third outer surface, the light-modulating element controlling a transmittance corresponding to a ratio of an amount of light emitted from the third outer surface to an amount of light incident on the fourth outer surface; and
a first optical sensor including a light receiving surface facing the light-modulating element, and measuring brightness of external light which is transmitted through the light-modulating element, wherein
the light-modulating element comprises a transmittance variable element of one of a suspended particle device (SPD), a guest-host liquid crystal element, or an electrochemical reaction element,
the light-modulating element is set to have a first transmittance in the non-display mode, and a second transmittance lower than the first transmittance based on a measurement result obtained from the first optical sensor in the display mode,
the second outer surface faces an observation position on the display device,
the fourth outer surface faces a substance, and
when the display device is observed from the observation position in the non-display mode, the substance is observed via the display panel and the light-modulating element.

2. The display device of claim 1, wherein the second transmittance is set to a first level when the measurement result is a first illuminance, and set to a second level which is greater than or equal to the first level when the measurement result is a second illuminance lower than the first illuminance.

3. The display device of claim 2, wherein the second transmittance of the first level corresponds to a transmittance of a minimum level in the light-modulating element.

4. The display device of claim 1, wherein the display panel comprises a display element of one of a polymer dispersed liquid crystal element and an electroluminescent element.

5. A display device comprising:
- a display panel including a first outer surface and a second outer surface which is on a side opposite to the first outer surface, the display panel comprising a first area including a display element having a non-display mode in which light is transmitted between the first outer surface and the second outer surface, and a display mode in which display is made toward the second outer surface, and a transparent second area which transmits the light between the first outer surface and the second outer surface;
- a light-modulating element including a third outer surface opposed to the first outer surface, and a fourth outer surface which is on a side opposite to the third outer surface, the light-modulating element comprising a third area which is opposed to the first area, and a transparent fourth area which is opposed to the second area and transmits the light between the third outer surface and the fourth outer surface, the fourth outer surface being not covered with a reflective layer; and
- a first optical sensor including a light receiving surface facing the light-modulating element, and measuring brightness of external light which is transmitted through the light-modulating element, wherein
- the light-modulating element comprises a transmittance variable element of one of a suspended particle device (SPD), a guest-host liquid crystal element, or an electrochemical reaction element,
- the third area is set to have a first transmittance in the non-display mode, and a second transmittance lower than the first transmittance based on a measurement result obtained from the first optical sensor in the display mode,
- the second outer surface faces an observation position on the display device,
- the fourth outer surface faces a substance, and
- when the display device is observed from the observation position in the non-display mode, the substance is observed via the display panel and the light-modulating element.

6. The display device of claim 5, wherein the second transmittance is set to a first level when the measurement result is a first illuminance, and set to a second level which is greater than or equal to the first level when the measurement result is a second illuminance lower than the first illuminance.

7. The display device of claim 6, wherein the second transmittance of the first level corresponds to a transmittance of a minimum level in the light-modulating element.

8. The display device of claim 5, wherein the display panel comprises a display element of one of a polymer dispersed liquid crystal element and an electroluminescent element.

* * * * *